(12) United States Patent
Seo et al.

(10) Patent No.: US 12,087,696 B2
(45) Date of Patent: *Sep. 10, 2024

(54) SEMICONDUCTOR PACKAGE

(71) Applicant: SAMSUNG ELECTRONICS CO., LTD., Suwon-si (KR)

(72) Inventors: Sunkyoung Seo, Cheonan-si (KR); Taehwan Kim, Hwaseong-si (KR); Hyunjung Song, Busan (KR); Hyoeun Kim, Cheonan-si (KR); Wonil Lee, Hwaseong-si (KR); Sanguk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,900

(22) Filed: Jan. 11, 2023

(65) Prior Publication Data
US 2023/0170304 A1    Jun. 1, 2023

Related U.S. Application Data

(63) Continuation of application No. 17/003,639, filed on Aug. 26, 2020, now Pat. No. 11,574,873.

(30) Foreign Application Priority Data

Dec. 24, 2019  (KR) ........................ 10-2019-0174286

(51) Int. Cl.
*H01L 23/48*  (2006.01)
*H01L 23/00*  (2006.01)
(Continued)

(52) U.S. Cl.
CPC ........ *H01L 23/5384* (2013.01); *H01L 23/367* (2013.01); *H01L 23/5385* (2013.01); *H01L 23/5386* (2013.01); *H01L 24/14* (2013.01)

(58) Field of Classification Search
CPC ............ H01L 23/5385; H01L 23/5386; H01L 23/367; H01L 24/02; H01L 24/24; H01L 24/18; H01L 24/01; H01L 24/14
See application file for complete search history.

(56) References Cited

U.S. PATENT DOCUMENTS 6,707,158 B2    3/2004  Nose
7,829,992 B2    11/2010  Sugino et al.
(Continued)

FOREIGN PATENT DOCUMENTS

KR    10-2003-0048249 A    6/2003

OTHER PUBLICATIONS

Communication dated Mar. 21, 2024, issued by the Korean Intellectual Property Office in Korean Application No. 10-2019-0174286.

*Primary Examiner* — Hoa B Trinh
(74) *Attorney, Agent, or Firm* — Sughrue Mion, PLLC

(57) ABSTRACT

A semiconductor package includes a package substrate, a lower semiconductor device arranged on the package substrate and including first through electrodes, first lower connection bumps arranged between the package substrate and the lower semiconductor device and electrically connecting the package substrate to the first through electrodes, a connecting substrate arranged on the package substrate and including second through electrodes, second lower connection bumps arranged between the package substrate and the connecting substrate and electrically connecting the package substrate to the second through electrodes, and an upper semiconductor device arranged on the lower semiconductor device and electrically connected to the first through electrodes and the second through electrodes.

19 Claims, 31 Drawing Sheets

(51) Int. Cl.
   *H01L 23/367*   (2006.01)
   *H01L 23/538*   (2006.01)

(56) References Cited

U.S. PATENT DOCUMENTS

| | | |
|---|---|---|
| 8,884,416 B2 | 11/2014 | Lee et al. |
| 9,129,828 B2 | 9/2015 | Kikuchi et al. |
| 9,209,156 B2 | 12/2015 | Len et al. |
| 9,543,242 B1 | 1/2017 | Kelly et al. |
| 9,711,494 B2 * | 7/2017 | England ............... H01L 24/96 |
| 9,899,361 B2 | 2/2018 | Kim et al. |
| 10,026,671 B2 | 7/2018 | Yu et al. |
| 10,068,874 B2 | 9/2018 | Nelson et al. |
| 10,373,935 B2 | 5/2019 | Seo et al. |
| 2009/0102037 A1 | 4/2009 | Kim |
| 2011/0140283 A1 | 6/2011 | Chandra et al. |
| 2018/0331087 A1 | 11/2018 | Lee et al. |
| 2019/0051642 A1 | 2/2019 | Gupta Hyde et al. |
| 2019/0067157 A1 | 2/2019 | Lin et al. |
| 2020/0035597 A1 * | 1/2020 | Uchiyama ........ H01L 21/76898 |
| 2020/0273801 A1 * | 8/2020 | Kim ............... H01L 23/5385 |
| 2021/0104462 A1 * | 4/2021 | Lee .................. H01L 24/05 |

* cited by examiner

SEMICONDUCTOR PACKAGE

CROSS-REFERENCE TO RELATED APPLICATION

This application is a Continuation of U.S. application Ser. No. 17/003,639 filed on Aug. 26, 2020, which claims priority from Korean Patent Application No. 10-2019-0174286, filed on Dec. 24, 2019, in the Korean Intellectual Property Office, the disclosures of each of which being incorporated by reference herein in their entireties.

BACKGROUND

1. Field

Apparatuses, devices, methods and articles of manufacture consistent with the present disclosure related to a semiconductor package, and more particularly, to a semiconductor package having improved heat dissipation characteristics.

2. Description of the Related Art

In general, a semiconductor package is formed by performing a packaging process on semiconductor chips formed by performing various semiconductor processes on a wafer. Recently, various semiconductor chips have been packaged in one semiconductor package and the semiconductor chips are electrically connected to each other so that the electrically connected semiconductor chips operate as a system. When the semiconductor chips operate, excessive heat may be generated and accordingly, the performance of the semiconductor package may deteriorate.

SUMMARY

It is an aspect to provide a semiconductor package having improved heat dissipation characteristics.

According to an aspect of an exemplary embodiment, there is provided a semiconductor package comprising a package substrate; a lower semiconductor device arranged on the package substrate and including a plurality of first through electrodes; a plurality of first lower connection bumps arranged between the package substrate and the lower semiconductor device and electrically connecting the package substrate to the plurality of first through electrodes; a connecting substrate arranged on the package substrate and including a plurality of second through electrodes; a plurality of second lower connection bumps arranged between the package substrate and the connecting substrate and electrically connecting the package substrate to the plurality of second through electrodes; and an upper semiconductor device arranged on the lower semiconductor device and electrically connected to the plurality of first through electrodes and the plurality of second through electrodes.

According to another aspect of an exemplary embodiment, there is provided a semiconductor package comprising a lower semiconductor device including a plurality of first through electrodes; connecting substrate including a plurality of second through electrodes; an upper semiconductor device stacked on an upper surface of the lower semiconductor device and an upper surface of the connecting substrate, the upper semiconductor device being electrically connected to the plurality of first through electrodes and the plurality of second through electrodes; and a redistribution structure arranged on a lower surface of the lower semiconductor device and a lower surface of the connecting substrate, the redistribution structure being electrically connected to the plurality of first through electrodes and to the plurality of second through electrodes.

According to yet another aspect of an exemplary embodiment, there is provided a semiconductor package comprising a package substrate; a memory chip arranged on the package substrate and including a plurality of first through electrodes; a connecting substrate arranged on the package substrate and including a plurality of second through electrodes, each of the plurality of second through electrodes having a second width greater than a first width of each of the plurality of first through electrodes; a logic chip arranged on an upper surface of the memory chip and an upper surface of the connecting substrate, the logic chip electrically connected to the plurality of first through electrodes and the plurality of second through electrodes; a heat dissipation member on the logic chip; a redistribution structure arranged on a lower surface of the memory chip and a lower surface of the connecting substrate, the redistribution structure including a plurality of first lower bump pads electrically connected to the plurality of first through electrodes, respectively, and including a plurality of second lower bump pads electrically connected to the plurality of second through electrodes, respectively; a plurality of first lower connection bumps between the plurality of first lower bump pads and the package substrate; and a plurality of second lower connection bumps between the plurality of second lower bump pads and the package substrate. The memory chip comprises a first substrate including a first surface facing the logic chip and a second surface opposite to the first surface; and a first semiconductor device layer on the first surface of the first substrate. The logic chip comprises a second substrate including a third surface facing the memory chip and a fourth surface opposite to the third surface; and a second semiconductor device layer on the third surface of the second substrate, and wherein a plane area of the logic chip is greater than a sum of a plane area of the memory chip and a plane area of the connecting substrate.

According to yet another aspect of an exemplary embodiment, there is provided a semiconductor package comprising a memory chip including a plurality of first through electrodes each having a first width and including a plurality of second through electrodes each having a second width different from the first width; and a logic chip arranged on the memory chip and electrically connected to the plurality of first through electrodes and to the plurality of second through electrodes, wherein the logic chip is configured to receive power through the plurality of second through electrodes, and wherein the memory chip and the logic chip have a same plane area.

BRIEF DESCRIPTION OF THE DRAWINGS

These and other aspects will be more clearly understood from the following detailed description taken in conjunction with the accompanying drawings, in which.

DETAILED DESCRIPTION

Figure 1:
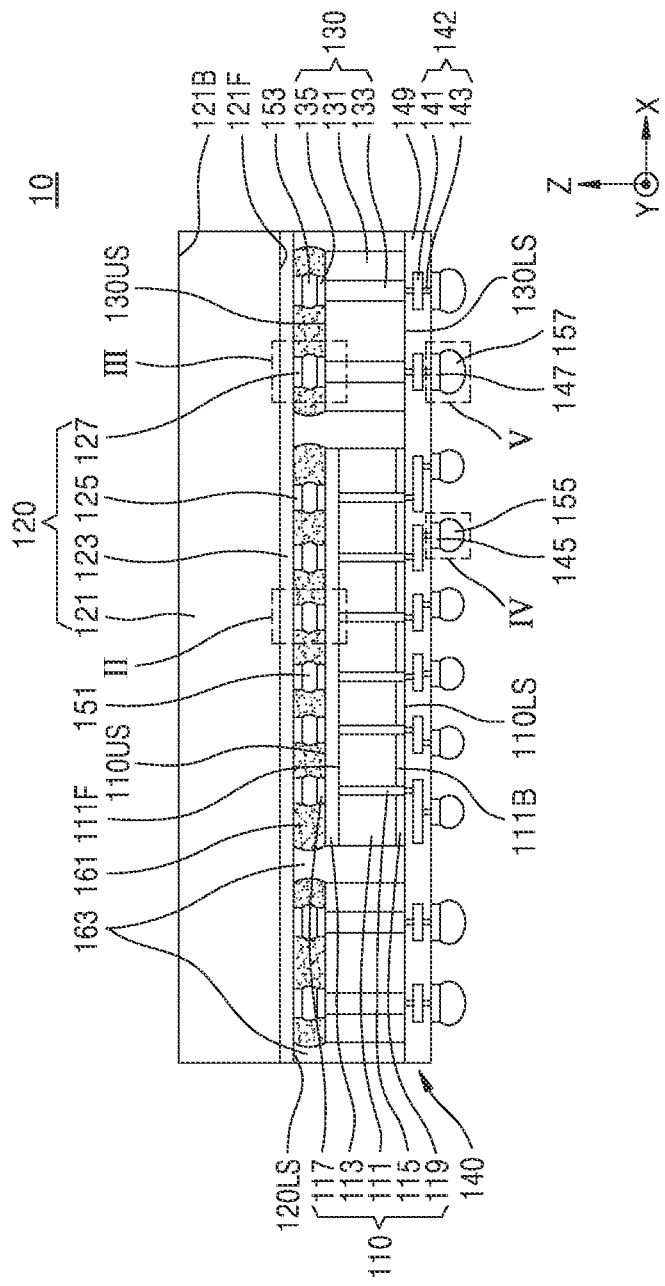
FIG. 1 is a cross-sectional view illustrating a semiconductor package according to various exemplary embodiments.

Hereinafter, various exemplary embodiments will be described in detail with reference to the accompanying drawings. Like reference numerals refer to like elements throughout and previously given descriptions will be omitted for conciseness.

Figure 2:
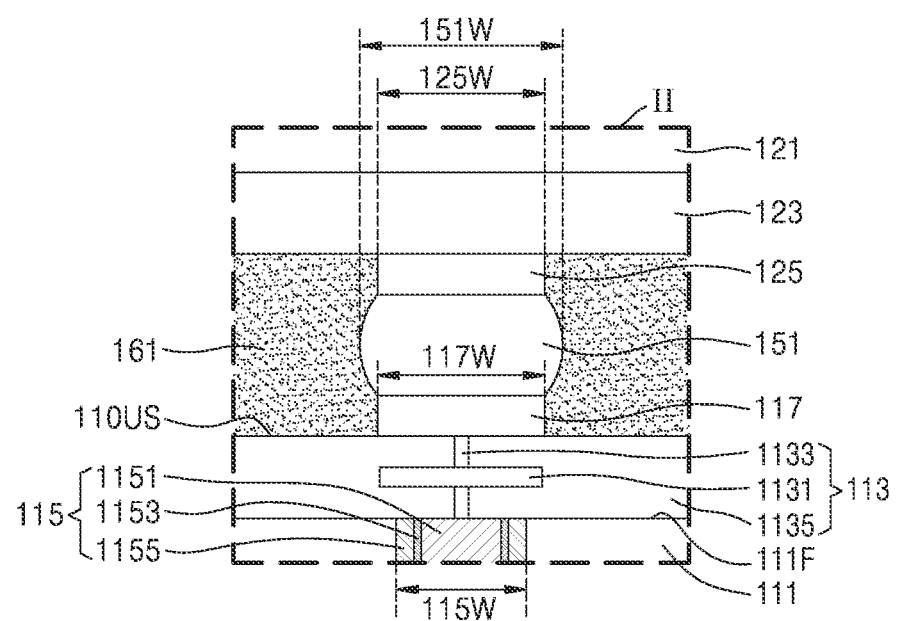
FIG. 2 is an enlarged cross-sectional view illustrating a region II of the semiconductor package illustrated in FIG. 1.
Figure 3:
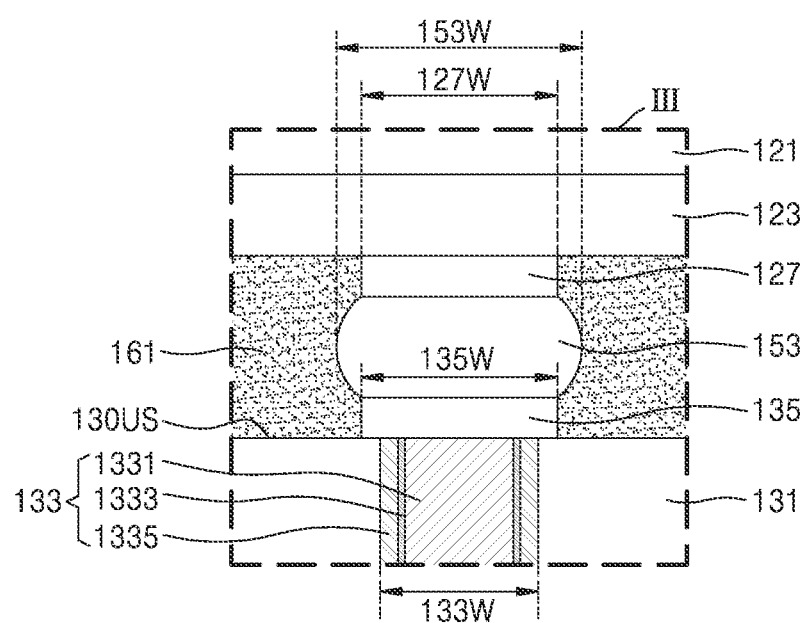
FIG. 3 is an enlarged cross-sectional view illustrating a region III of the semiconductor package illustrated in FIG. 1.
Figure 4:
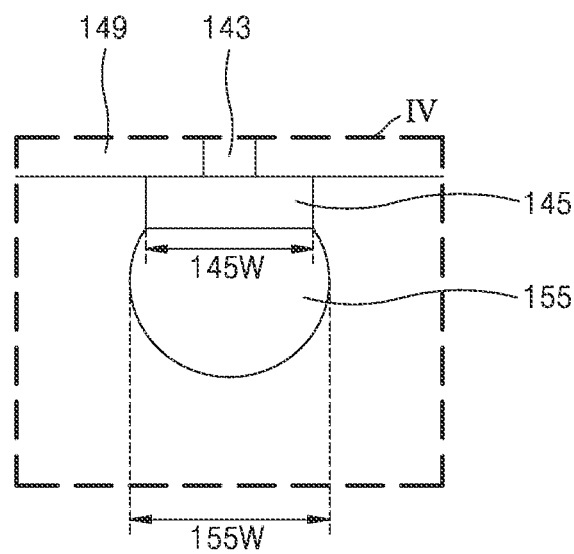
FIG. 4 is an enlarged cross-sectional view illustrating a region IV of the semiconductor package illustrated in FIG. 1.
Figure 5:
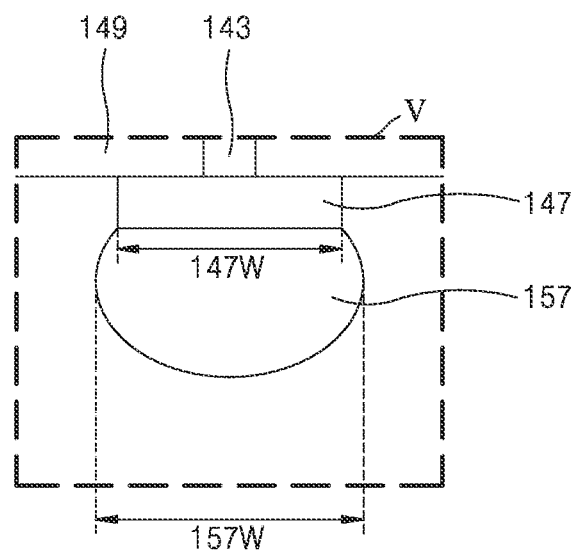
FIG. 5 is an enlarged cross-sectional view illustrating a region V of the semiconductor package illustrated in FIG. 1.

FIG. 1 is a cross-sectional view illustrating a semiconductor package 10 according to various exemplary embodiments. FIG. 2 is an enlarged cross-sectional view illustrating a region II in FIG. 1. FIG. 3 is an enlarged cross-sectional view illustrating a region III in FIG. 1. FIG. 4 is an enlarged cross-sectional view illustrating a region IV in FIG. 1. FIG. 5 is an enlarged cross-sectional view illustrating a region V in FIG. 1.

Referring to FIGS. 1 to 5, the semiconductor package 10 may include a lower semiconductor device 110, an upper semiconductor device 120, connecting substrates 130, a first molding layer 163, and a first redistribution structure 140.

The upper semiconductor device 120 may be stacked on the lower semiconductor device 110. A planar area (or a foot print) of the upper semiconductor device 120 may be greater than a planar area (or a foot print) of the lower semiconductor device 110. In a view from above, the lower semiconductor device 110 may be arranged to overlap the upper semiconductor device 120 in a vertical direction (for example, a Z direction). See, e.g., FIGS. 6A-6C.

In addition, the upper semiconductor device 120 may be stacked on the connecting substrates 130 that are apart from the lower semiconductor device 110 in a horizontal direction (e.g., an X direction in the example illustrated in FIG. 1). The planar area of the upper semiconductor device 120 may be greater than a sum of the planar area of the lower semiconductor device 110 and a planar area of the connecting substrates 130. In a view from above, the lower semiconductor device 110 and the connecting substrates 130 may be arranged to overlap the upper semiconductor device 120 in the vertical direction.

In some exemplary embodiments, when power signals are supplied to the lower semiconductor device 110 and the upper semiconductor device 120, the upper semiconductor device 120 may generate an amount of heat greater than an amount of heat generated by the lower semiconductor device 110. For heat dissipation on the upper semiconductor device 120, in some exemplary embodiments, a heat dissipation member (for example, refer to 180 of FIG. 12) such as a heat sink may be arranged on the upper semiconductor device 120 and/or, in other exemplary embodiments, at least a part of a surface of the upper semiconductor device 120 may be exposed to the outside.

In exemplary embodiments, the lower semiconductor device 110 may include a memory chip. For example, the lower semiconductor device 110 may include a volatile memory chip and/or a non-volatile memory chip. The volatile memory chip may be, for example, dynamic random access memory (DRAM), high bandwidth memory (HBM) DRAM, static RAM (SRAM), thyristor RAM (TRAM), zero capacitor RAM (ZRAM), or twin transistor RAM (TTRAM). In addition, the non-volatile memory chip may be, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

In exemplary embodiments, the upper semiconductor device 120 may include a logic chip. The upper semiconductor device 120 may include a central processing unit (CPU) chip, a graphics processing unit (GPU) chip, or an application processor (AP) chip. For example, the upper semiconductor device 120 may include a control chip for controlling the lower semiconductor device 110.

The lower semiconductor device 110 may include a first semiconductor substrate 111, a first semiconductor device layer 113, first through electrodes 115, first upper bump pads 117, and a first back side protective layer 119.

The first semiconductor substrate 111 may include a first surface 111F and a second surface 111B opposite to each other. The first surface 111F of the first semiconductor substrate 111 may be an active surface of the first semiconductor substrate 111, and the second surface 111B of the first semiconductor substrate 111 may be an inactive surface of the first semiconductor substrate 111. In exemplary embodiments, the lower semiconductor device 110 may be arranged so that the first surface 111F of the first semiconductor substrate 111 faces the upper semiconductor device 120.

In some exemplary embodiments, the first semiconductor substrate 111 may include, for example, silicon (Si). Alternatively, in some exemplary embodiments, the first semiconductor substrate 111 may include a semiconductor element such as a semiconductor element such as germanium (Ge) or a compound semiconductor such as silicon carbide (SiC), gallium arsenide (GaAs), indium arsenide (InAs), or indium phosphide (InP). Alternatively, in some exemplary embodiments, the first semiconductor substrate 111 may have a silicon on insulator (SOI) structure. For example, the first semiconductor substrate 111 may include a buried oxide (BOX) layer. The first semiconductor substrate 111 may include a conductive region, for example, a well doped with impurities or a structure doped with impurities. In addition, the first semiconductor substrate 111 may have various device isolation structures such as a shallow trench isolation (STI) structure.

The first semiconductor device layer 113 is formed on the first surface 111F of the first semiconductor substrate 111 and may include a frond-end-of-line (FEOL) structure and a back-end-of-line (BEOL) structure.

For example, the first semiconductor device layer 113 may include a plurality of various kinds of individual devices and an interlayer insulating layer. The plurality of various kinds of individual devices may include various microelectronic devices, for example, a metal-oxide-semiconductor field effect transistor (MOSFET) such as a complementary metal-insulator-semiconductor (CMOS) transistor, an image sensor such as a system large scale integration (LSI), or a CMOS imaging sensor (CIS), a micro-electro-mechanical system (MEMS), an active element, and a passive element.

For example, the first semiconductor device layer 113 may include a wiring structure for connecting the plurality of individual devices to other wiring lines formed on the first semiconductor substrate 111. The wiring structure may include a metal wiring layer 1131 and a via plug 1133 formed in an insulating layer 1135. The metal wiring layer 1131 and the via plug 1133 may include a wiring barrier layer and a wiring metal layer. The wiring barrier layer may include at least one material selected from Ti, TiN, Ta, or TaN. The wiring metal layer may include at least one metal selected from tungsten (W), aluminum (Al), or copper (Cu). The metal wiring layer 1131 and the via plug 1133 may be formed of a same material. Alternatively, in some exemplary embodiments, at least parts of the metal wiring layer 1131 and the via plug 1133 may include different materials.

The first through electrodes 115 may pass through the first semiconductor substrate 111. The first through electrodes 115 may be used for signal transmission between an external device and the lower semiconductor device 110, for example, transmission of input/output data signals and a power signal. The first through electrodes 115 may be used for signal transmission between the external device and the upper semiconductor device 120, for example, transmission of the input/output data signals and the power signal.

Each of the first through electrodes 115 may include a first core conductive material 1151, a first barrier layer 1153, and a first via dielectric layer 1155.

The first core conductive material 1511 may include one or more of, for example, aluminum (Al), gold (Au), beryllium (Be), bismuth (Bi), cobalt (Co), copper (Cu), hafnium (Hf), indium (In), magnesium (Mg), manganese (Mn), molybdenum (Mo), nickel (Ni), lead (Pb), palladium (Pd), platinum (Pt), rhodium (Rh), rhenium (Re), ruthenium (Ru), tin (Sn), tantalum (Ta), tellurium (Te), titanium (Ti), tungsten (W), zinc (Zn), and zirconium (Zr).

The first barrier layer 1153 may contact and surround side surfaces of the first core conductive material 1151. The first barrier layer 1153 may include a conductive layer having low wiring resistance. For example, the first barrier layer 1153 may include a single layer or a multilayer including at least one of W, WN, WC, Ti, TiN, Ta, TaN, Ru, Co, Mn, WN, Ni, or NiB. For example, the first barrier layer 1153 may include a multilayer formed of TaN/W, TiN/W, or WN/W. The first barrier layer 1153 may be formed by chemical vapor deposition (CVD) or physical vapor deposition (PVD).

The first via dielectric layer 1155 may surround side surfaces of the first barrier layer 1153 and may insulate the first core conductive material 1151 from the first semiconductor substrate 111. The first via dielectric layer 1155 may include an oxide layer, a nitride layer, a carbide layer, polymer, or a combination of the above materials. The first via dielectric layer 1155 may be formed by CVD.

FIGS. 1 and 2 illustrate that the first through electrodes 115 extend from a lower surface 110LS of the lower semiconductor device 110 to the first surface 111F of the first semiconductor substrate 111. However, exemplary embodiments are not limited thereto. For example, in some exemplary embodiments, parts of the first through electrodes 115 may extend further to the inside of the first semiconductor device layer 113 or may pass through the first semiconductor device layer 113.

The first upper bump pads 117 may be arranged on the first semiconductor device layer 113. The first upper bump pads 117 may be electrically connected to the first through electrodes 115, respectively. For example, the first upper bump pads 117 may be electrically connected to the first through electrodes 115 through the wiring structure in the first semiconductor device layer 113. For example, the first upper bump pads 117 may include Al, Cu, Ni, W, Pt, Au, or a combination of the above metals.

The first back side protective layer 119 may be formed on the second surface 111B of the first semiconductor substrate 111. The first back side protective layer 119 may surround side surfaces of the first through electrodes 115 protruding from the second surface 111B of the first semiconductor substrate 111. The first back side protective layer 119 may include, for example, an inorganic insulating layer or an organic insulating layer.

The upper semiconductor device 120 may include a second semiconductor substrate 121, a second semiconductor device layer 123, first bump pads 125, and second bump pads 127.

The second semiconductor substrate 121 may include a first surface 121F and a second surface 121B opposite to each other. The first surface 121F of the second semiconductor substrate 121 may be an active surface of the second semiconductor substrate 121, and the second surface 121B of the second semiconductor substrate 121 may be an inactive surface of the second semiconductor substrate 121. In exemplary embodiments, the upper semiconductor device 120 may be arranged so that the first surface 121F of the second semiconductor substrate 121 faces the upper surface 110US of the lower semiconductor device 110. Because the second semiconductor substrate 121 may be the same as or similar to the first semiconductor substrate 111, detailed description thereof will not be given for conciseness.

The second semiconductor device layer 123 may be formed on the first surface 121F of the second semiconductor substrate 121. The second semiconductor device layer 123 may include an FEOL structure and a BEOL structure. Because the second semiconductor device layer 123 may be the same as or similar to the first semiconductor device layer 113, detailed description thereof will not be given for conciseness.

First bump pads 125 and the second bump pads 127 may be arranged on the second semiconductor device layer 123. The first bump pads 125 and the second bump pads 127 may be electrically connected to the wiring structure in the second semiconductor device layer 123. The first bump pads 125 and the second bump pads 127 may include, for example, Al, Cu, Ni, W, Pt, or Au, or a combination of these metals.

Each of the connecting substrates 130 may include a base layer 131, second through electrodes 133, and second upper bump pads 135.

The base layer 131 may be formed of a semiconductor material or an insulating material. For example, the base layer 131 may include at least one of Si, Ge, SiGe, GaAs, glass, or ceramic.

The second through electrodes 133 may pass through the base layer 131. Each of the second through electrodes 133 may include a second core conductive material 1331, a second barrier layer 1333 surrounding side surfaces of the second core conductive material 1331, and a second via dielectric layer 1335 surrounding side surfaces of the second barrier layer 1333. Because the second core conductive material 1331, the second barrier layer 1333, and the second via dielectric layer 1335 may be respectively the same as or similar to the first core conductive material 1151, the first barrier layer 1153, and the first via dielectric layer 1155, detailed description thereof will not be given for conciseness.

The second upper bump pads 135 may be arranged on upper surfaces 130US of the connecting substrates 130 facing the upper semiconductor device 120. The second upper bump pads 135 may be electrically connected to the second through electrodes 133, respectively. For example, the second upper bump pads 135 may include Al, Cu, Ni, W, Pt, or Au, or a combination of these metals.

Between the upper semiconductor device 120 and the lower semiconductor device 110, first upper connection bumps 151 for electrically connecting the upper semiconductor device 120 to the lower semiconductor device 110 may be arranged. Lower portions of the first upper connection bumps 151 may be attached to the first upper bump pads 117 of the lower semiconductor device 110, respectively, and upper portions of the first upper connection bumps 151 may be attached to the first bump pads 125 of the upper semiconductor device 120, respectively. The first upper semiconductor device 120 may be electrically connected to the first through electrodes 115 through the first upper connection bumps 151. The first upper connection bumps 151 may be used for signal transmission between the upper semiconductor device 120 and the lower semiconductor device 110 or between an external device and the upper semiconductor device 120.

Between the upper semiconductor device 120 and the connecting substrates 130, second upper connection bumps 153 for electrically connecting the upper semiconductor device 120 to the second through electrodes 133 of the connecting substrates 130 may be arranged. Lower portions of the second upper connection bumps 153 may be attached to the second upper bump pads 135 of the connecting substrates 130, respectively, and upper portions of the second upper connection bumps 153 may be attached to the second bump pads 127 of the upper semiconductor device 120, respectively. The second upper connection bumps 153 may be used for signal transmission between the external device and the upper semiconductor device 120.

Between the upper semiconductor device 120 and the lower semiconductor device 110 and between the upper semiconductor device 120 and the connecting substrates 130, an insulation adhesive layer 161 may be arranged. The insulation adhesive layer 161 may surround the first upper connection bumps 151 between the upper semiconductor device 120 and the lower semiconductor device 110 and may surround the second upper connection bumps 153 between the upper semiconductor device 120 and the connecting substrates 130. The insulation adhesive layer 161 may include, for example, a non-conductive film (NCF).

The first molding layer 163 may be formed on a lower surface 120LS of the upper semiconductor device 120 and may mold the lower semiconductor device 110 and the connecting substrates 130. The first molding layer 163 may surround side surfaces of the lower semiconductor device 110 and may surround side surfaces of the connecting substrates 130. The first molding layer 163 may contact the side surfaces of the lower semiconductor device 110 and the side surfaces of the connecting substrates 130. In some exemplary embodiments, the first molding layer 163 may not cover the lower surface 110LS of the lower semiconductor device 110 and lower surfaces 130LS of the connecting substrates 130 that face the first redistribution structure 140. In addition, the first molding layer 163 may cover a part of the lower surface 120LS of the upper semiconductor device 120. The first molding layer 163 may protect the lower semiconductor device 110 and the connecting substrates 130 against an external environment.

For example, the first molding layer 163 may include an epoxy-group molding resin or a polyimide-group molding resin. In exemplary embodiments, the first molding layer 163 may include epoxy molding compound (EMC).

The first redistribution structure 140 may be arranged on the lower surface 110LS of the lower semiconductor device 110, the lower surfaces 130LS of the connecting substrates 130, and a lower surface of the first molding layer 163. The first redistribution structure 140 may include a first redistribution pattern 142 and a first redistribution insulation layer 149.

The first redistribution insulation layer 149 may contact the lower surface 110LS of the lower semiconductor device 110, the lower surfaces 130LS of the connecting substrates 130, and the lower surface of the first molding layer 163. The first redistribution insulation layer 149 may electrically insulate various components included in the first redistribution structure 140 from each other. The first redistribution insulation layer 149 may include a photo-imagable dielectric (PID) insulating material capable of being used in a photolithography process. For example, the first redistribution insulation layer 149 may be formed of photosensitive polyimide. Alternatively, in some exemplary embodiments, the first redistribution insulation layer 149 may include a silicon oxide or a silicon nitride.

The first redistribution pattern 142 may electrically connect first lower connection bumps 155 to the first through electrodes 115 of the lower semiconductor device 110, respectively, and may connect second lower connection bumps 157 to the second through electrodes 133, respectively, of the connecting substrates 130. For example, the first redistribution pattern 142 may include a conductive line pattern 141 extending in a horizontal direction and a conductive via pattern 143 extending in a vertical direction. The conductive via pattern 143 may electrically connect the conductive line pattern 141 to the first through electrodes 115, may electrically connect the conductive line pattern 141 to the second through electrodes 133, may electrically connect the conductive line pattern 141 to the first lower connection bumps 155, or may electrically connect the conductive line pattern 141 to the second lower connection bumps 157. In addition, in FIG. 1, the conductive line pattern 141 is illustrated as being a single layer. However, in some exemplary embodiments, a plurality of conductive line patterns 141 forming a multilayer may be provided in the first redistribution insulation layer 149 and the conductive via pattern 143 may electrically connect conductive line patterns 141 adjacent to each other vertically.

In exemplary embodiments, the first redistribution pattern 142 may include first lower bump pads 145 to which the first lower connection bumps 155 are attached, respectively, and second lower bump pads 147 to which the second lower connection bumps 157 are attached, respectively. At least parts of the first lower bump pads 145 and at least parts of the second lower bumps pads 147 may protrude from a lower surface of the first redistribution insulation layer 149.

In exemplary embodiments, the upper semiconductor device 120 may receive power required for operation of the upper semiconductor device 120 through the second through electrodes 133 of the connecting substrates 130. In more detail, power provided by the external device may be supplied to the upper semiconductor device 120 through the second lower connection bumps 157, the first redistribution pattern 142 of the first redistribution structure 140, the second through electrodes 133, and the second upper connection bumps 153.

As illustrated in FIGS. 2 and 3, each of the second through electrodes 133 may have a width greater than that of each of the first through electrodes 115. For example, in a first direction (for example, an X or Y direction) parallel with an upper surface 110US of the lower semiconductor device 110, a horizontal width 133W of each of the second through electrodes 133 may be greater than a horizontal width 115W of each of the first through electrodes 115. In exemplary embodiments, the horizontal width 133W of each of the second through electrodes 133 may be between about 10 μm to about 20 μm. In exemplary embodiments, the horizontal width 115W of each of the first through electrodes 115 may be between about 1 μm to about 7 μm.

In exemplary embodiments, each of the second through electrodes 133 has a width greater than that of each of the first through electrodes 115 and accordingly, power may be stably supplied to the upper semiconductor device 120. In addition, because the second through electrodes 133 may be formed by using an inexpensive process, production cost of the semiconductor package 10 may be reduced.

In exemplary embodiments, each of the second upper connection bumps 153 connected to the second through electrodes 133 may have a width greater than that of each of the first upper connection bumps 151 connected to the first through electrodes 115. For example, in the first direction parallel with the upper surface 110US of the lower semiconductor device 110, a maximum horizontal width 153W of each of the second upper connection bumps 153 may be greater than a maximum horizontal width 151W of each of the first upper connection bumps 151.

In exemplary embodiments, each of the second upper bump pads 135 connected to the second upper connection bumps 153 may have a width greater than that of each of the first upper bump pads 117 connected to the first upper connection bumps 151. For example, in the first direction parallel with the upper surface 110US of the lower semiconductor device 110, a horizontal width 135W of each of the second upper bump pads 135 may be greater than a horizontal width 117W of each of the first upper bump pads 117. In addition, each of the second bump pads 127 of the upper semiconductor device 120 connected to the second upper connection bumps 153 may have a width greater than that of each of the first bump pads 125 of the upper semiconductor device 120 connected to the first upper connection bumps 151. For example, in the first direction parallel with the upper surface 110US of the lower semiconductor device 110, a horizontal width 127W of each of the second bump pads 127 may be greater than a horizontal width 125W of each of the first bump pads 125.

As illustrated in FIGS. 4 and 5, each of the second lower connection bumps 157 connected to the second through electrodes 133 may have a width greater than that of each of the first lower connection bumps 155 connected to the first through electrodes 115. For example, in the first direction parallel with the upper surface 110US of the lower semiconductor device 110, the maximum horizontal width 157W of each of the second lower connection bumps 157 may be greater than the maximum horizontal width 155W of each of the first lower connection bumps 155.

In exemplary embodiments, each of the second lower bump pads 147 connected to the second lower connection bumps 157 may have a width greater than that of each of the first lower bump pads 145 connected to the first lower connection bumps 155. For example, in the first direction parallel with the upper surface 110US of the lower semiconductor device 110, a horizontal width 147W of each of the second lower bump pads 147 may be greater than a horizontal width 145W of each of the first lower bump pads 145.

In various exemplary embodiments, when the upper semiconductor device 120 is a logic chip and the lower semiconductor device 110 is a memory chip, because the logic chip is arranged at an upper side of the semiconductor package 10 advantageous to emitting heat, heat dissipation characteristics of the semiconductor package 10 may improve. In addition, because power may be supplied to the logic chip by using the second through electrodes 133 of the connecting substrates 130 with a large width, power may be stably supplied to the logic chip.

Figure 6A:
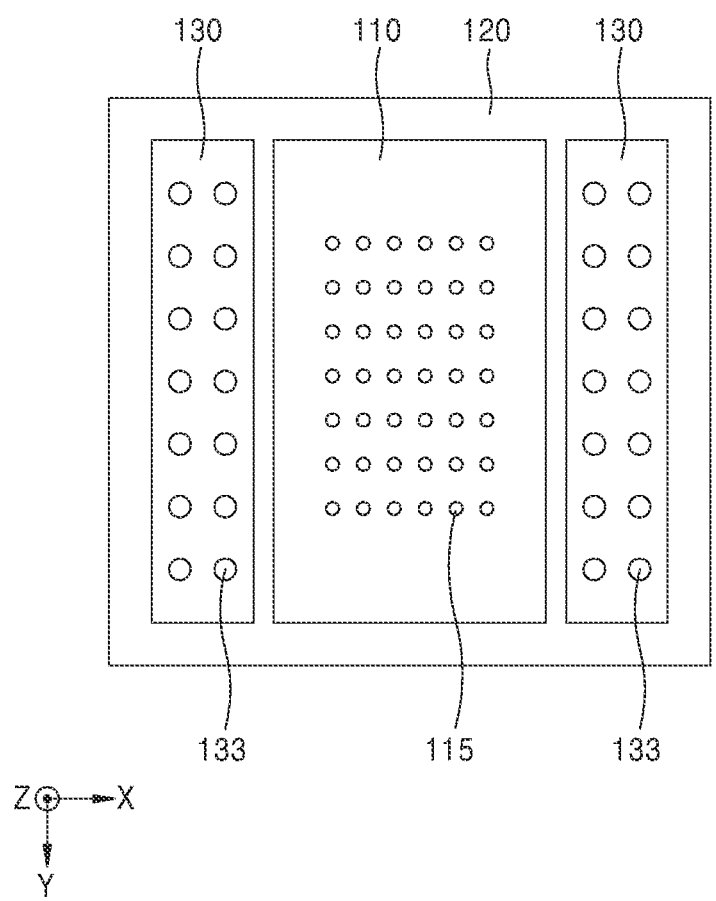
FIGS. 6A to 6C are plan views illustrating exemplary layouts of a lower semiconductor device and connecting substrate in a semiconductor package, according to various exemplary embodiments.
Figure 6B:
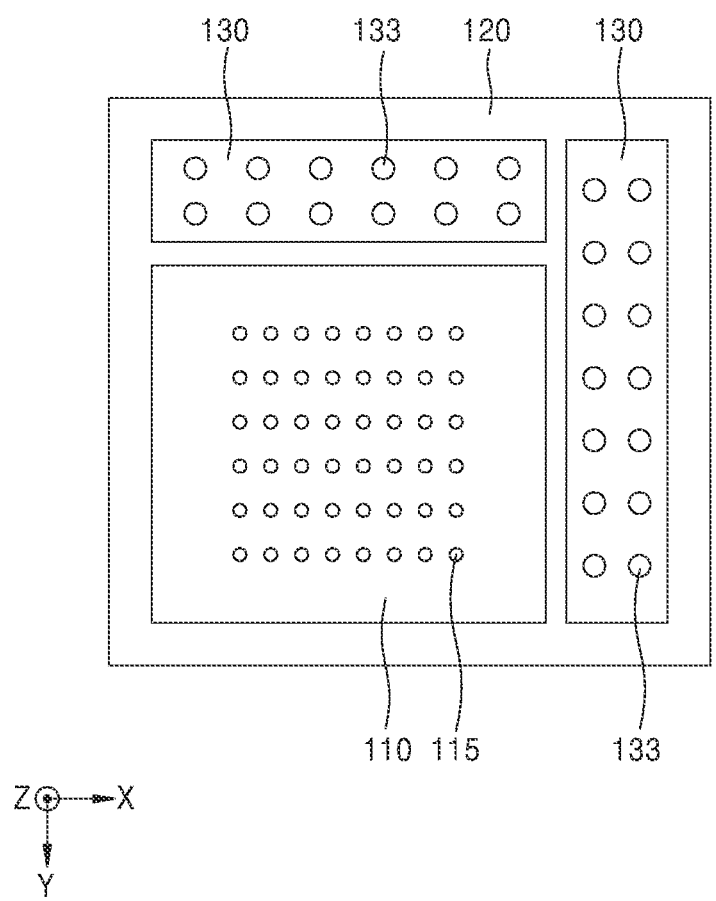
Figure 6C:
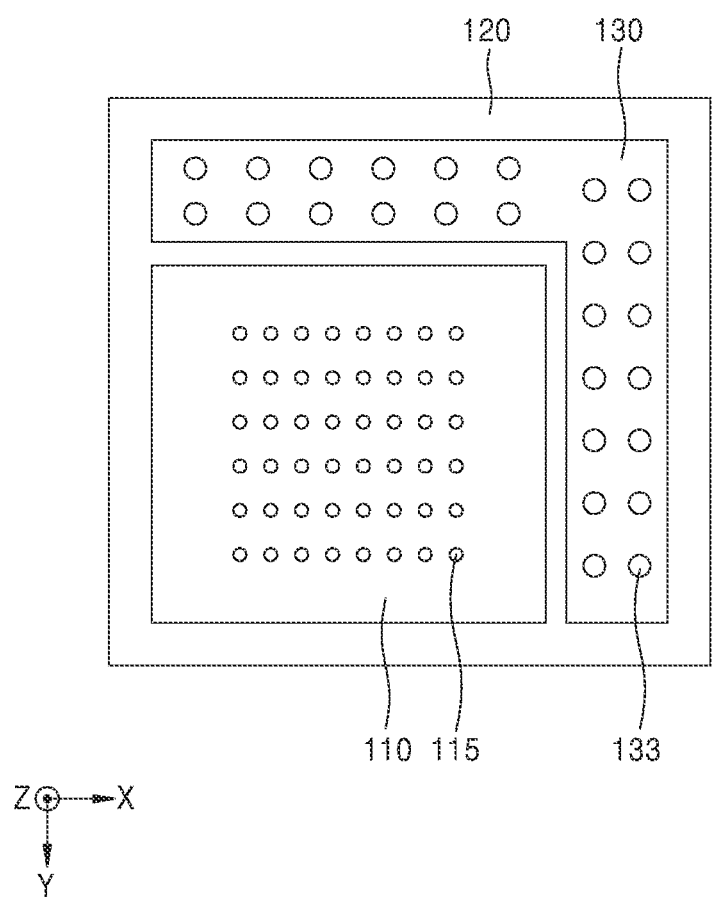

FIGS. 6A to 6C are plan views illustrating exemplary layouts of the lower semiconductor device 110 and the connecting substrates 130 in the semiconductor package 10.

Referring to FIG. 6A together with FIG. 1, the lower semiconductor device 110 and two connecting substrates 130 may be arranged on the lower surface 120LS of the upper semiconductor device 120. The lower semiconductor device 110 may be arranged on a center of the lower surface 120LS of the upper semiconductor device 120 and the two connecting substrates 130 may be spaced apart from each other with the lower semiconductor device 110 therebetween. The two connecting substrates 130 may respectively extend along two opposite edges of the lower semiconductor device 110. In FIG. 6A, it is illustrated that the two connecting substrates 130 are arranged in the semiconductor package 10. However, exemplary embodiments are not limited thereto, and in some exemplary embodiments, three or more connecting substrates 130 may be provided in the semiconductor package 10.

Referring to FIG. 6B, on the lower surface 120LS of the upper semiconductor device 120, the lower semiconductor device 110 and the two connecting substrates 130 are arranged and the two connecting substrates 130 may respectively extend along two adjacent edges of the lower semiconductor device 110.

Referring to FIG. 6C, on the lower surface 120LS of the upper semiconductor device 120, the lower semiconductor device 110 and one connecting substrate 130 may be arranged. The connecting substrate 130 may extend along the two adjacent edges of the lower semiconductor device 110 and may be bent. For example, as shown in FIG. 6C, the connecting substrate 130 may have an L-shape.

Figure 7:
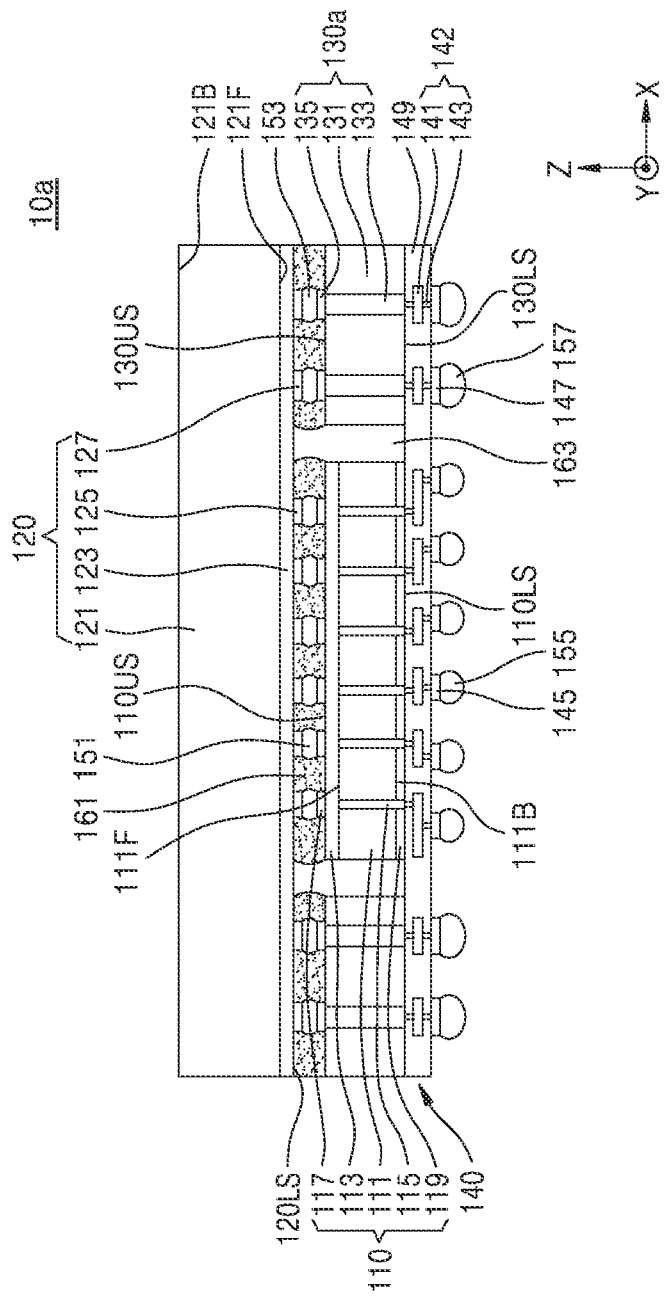
FIG. 7 is a cross-sectional view illustrating a semiconductor package according to exemplary embodiments.

FIG. 7 is a cross-sectional view illustrating a semiconductor package 10a according to various exemplary embodiments.

The semiconductor package 10a illustrated in FIG. 7 may be the same as or similar to the semiconductor package 10 illustrated in FIG. 1 except that the first molding layer 163 exposes parts of side surfaces of connecting substrates 130a. Hereinafter, a difference between the semiconductor package 10*a* illustrated in FIG. 7 and the semiconductor package 10 illustrated in FIG. 1 will be mainly described.

Referring to FIG. 7, the first molding layer 163 may cover some parts of the side surfaces of the connecting substrates 130*a* and may not cover the other parts of the side surfaces of the connecting substrates 130*a*. For example, second side surfaces opposite to first side surfaces of the connecting substrates 130*a* facing the lower semiconductor device 110 may not be covered with the first molding layer 163. In some exemplary embodiments, the second side surfaces of the connecting substrates 130*a* may be coplanar with side surfaces of the upper semiconductor device 120.

Figure 8:
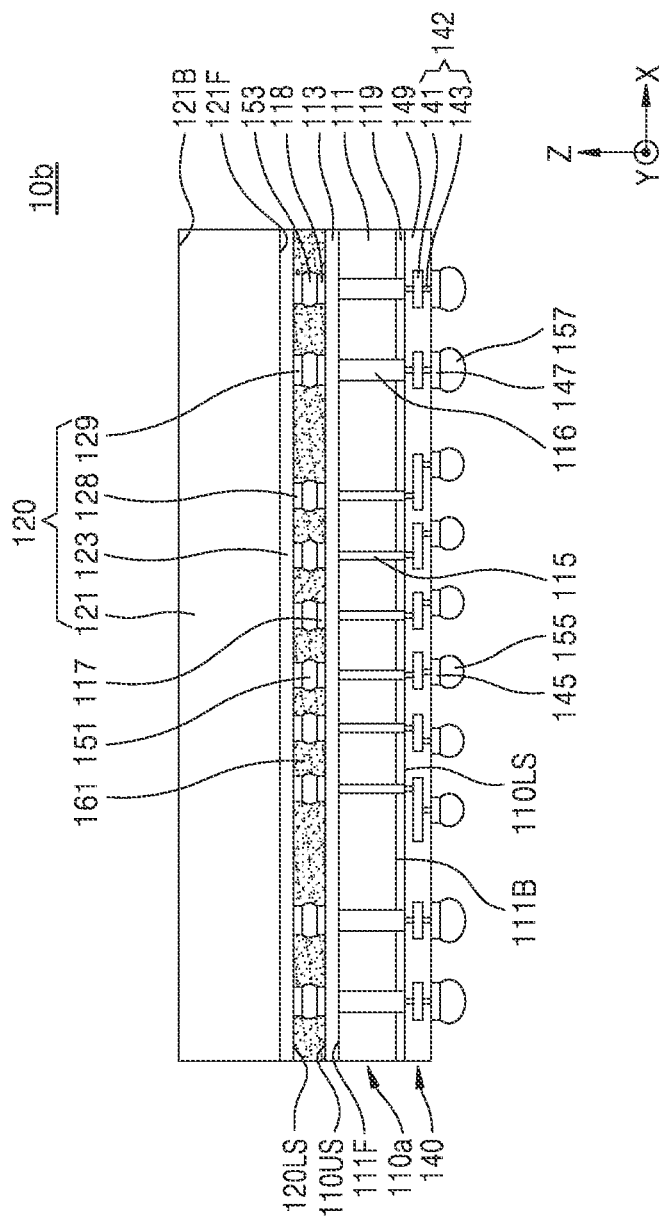
FIG. 8 is a cross-sectional view illustrating a semiconductor package according to exemplary embodiments.

FIG. 8 is a cross-sectional view illustrating a semiconductor package 10*b* according to various exemplary embodiments.

The semiconductor package 10*b* illustrated in FIG. 8 may be the same as or similar to the semiconductor package 10 illustrated in FIG. 1 except that the connecting substrates 130 (FIG. 1) are omitted and a lower semiconductor device 110*a* includes third through electrodes 116 corresponding respectively to the second through electrodes 133 (FIG. 1) of the connecting substrates 130. Hereinafter, a difference between the semiconductor package 10*b* illustrated in FIG. 8 and the semiconductor package 10 illustrated in FIG. 1 will be mainly described.

Referring to FIG. 8, the lower semiconductor device 110*a* may have a plane area equal to that of the upper semiconductor device 120. In this case, side surfaces of the lower semiconductor device 110*a* may coplanar with the side surfaces of the upper semiconductor device 120.

The lower semiconductor device 110*a* may include the first through electrodes 115 and the third through electrodes 116.

The first through electrodes 115 may be arranged, for example, in the central portion of the lower semiconductor device 110*a*. The first through electrodes 115 may be respectively and electrically connected to the first lower connection bumps 155, and the first upper connection bumps 151 and may be electrically connected to the upper semiconductor device 120 through the first upper connection bumps 151. In exemplary embodiments, the first through electrodes 115 may be used for signal transmission between the external device and the lower semiconductor device 110*a* or signal transmission between the external device and the upper semiconductor device 120.

The third through electrodes 116 may be arranged, for example, in the edge portion of the lower semiconductor device 110*a*. The third through electrodes 116 may be respectively and electrically connected to the second lower connection bumps 157 and the second upper connection bumps 153 and may be electrically connected to the upper semiconductor device 120 through the second upper connection bumps 153. In exemplary embodiments, the third through electrodes 116 may be used for supplying power to the upper semiconductor device 120.

Each of the third through electrodes 116 may have a width greater than that of each of the first through electrodes 115. For example, in the first direction parallel with the upper surface 110US of the lower semiconductor device 110*a*, a horizontal width of each of the third through electrodes 116 may be greater than that of each of the first through electrodes 115.

In addition, the lower semiconductor device 110*a* may include the first upper bump pads 117 to which the first upper connection bumps 151 are attached, respectively, and third upper bump pads 118 to which the second upper connection bumps 153 are attached, respectively. In exemplary embodiments, each of the third upper bump pads 118 connected to the second upper connection bumps 153 may have a width greater than that of each of the first upper bump pads 117 connected to the first upper connection bumps 151.

In exemplary embodiments, the semiconductor package 10*b* illustrated in FIG. 8 may be formed by a wafer-to-wafer bonding process between a lower wafer including the lower semiconductor device 110*a* and an upper wafer including the upper semiconductor device 120. When the lower wafer and the upper wafer are bonded by a direct wafer bonding method, the insulation adhesive layer 161, the first upper connection bumps 151, and the second upper connection bumps 153 may be omitted.

Figure 9:
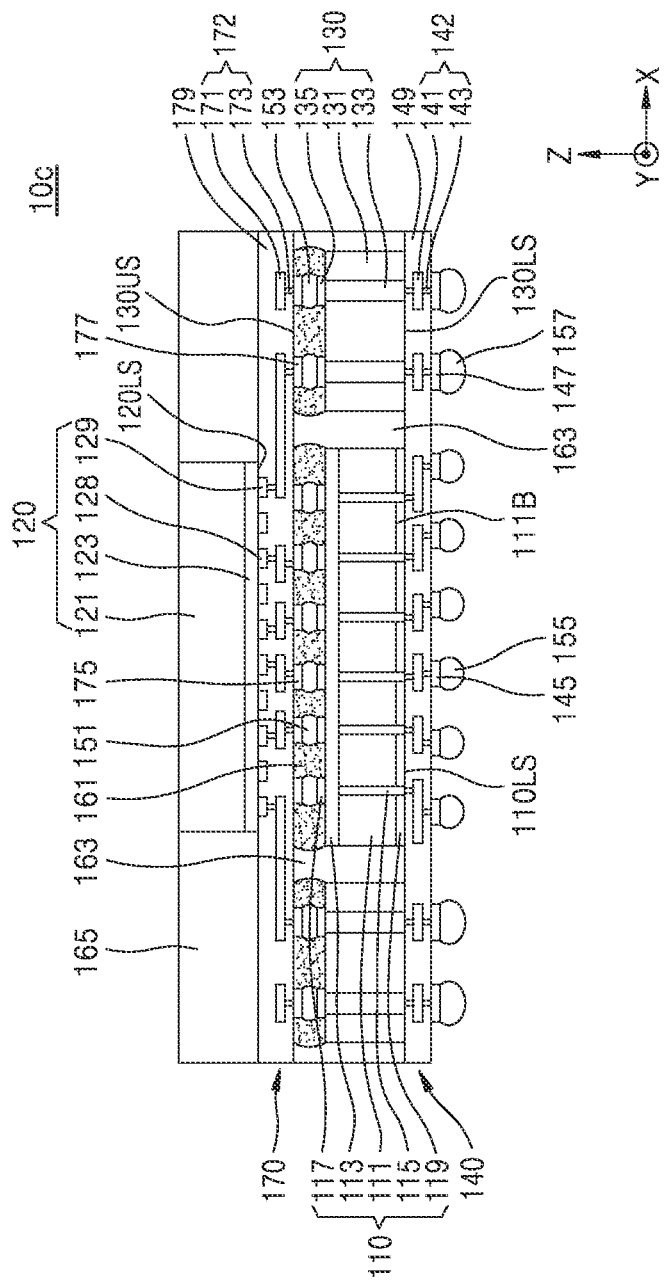
FIG. 9 is a cross-sectional view illustrating a semiconductor package according to exemplary embodiments.

FIG. 9 is a cross-sectional view illustrating a semiconductor package 10*c* according to various exemplary embodiments.

The semiconductor package 10*c* illustrated in FIG. 9 may be the same as or similar to the semiconductor package 10 illustrated in FIG. 1 except that the semiconductor package 10*c* further includes a second redistribution structure 170. Hereinafter, a difference between the semiconductor package 10*c* illustrated in FIG. 9 and the semiconductor package 10 illustrated in FIG. 1 will be mainly described.

Referring to FIG. 9, the upper semiconductor device 120 may have a plane area similar to that of the lower semiconductor device 110. For example, in some exemplary embodiments, the plane area of the upper semiconductor device 120 may be less than that of the lower semiconductor device 110. The second redistribution structure 170 may be arranged between the upper semiconductor device 120 and the lower semiconductor device 110 and between the upper semiconductor device 120 and the connecting substrates 130. The second redistribution structure 170 may include a second redistribution pattern 172 and a second redistribution insulation layer 179.

The second redistribution insulation layer 179 may contact the lower surface 120LS of the upper semiconductor device 120 and a lower surface of a molding layer 165 surrounding the side surfaces of the upper semiconductor device 120. The second redistribution insulation layer 179 may electrically insulate various components included in the second redistribution structure 170 from each other.

The second redistribution pattern 172 may electrically connect first pads 128 of the upper semiconductor device 120 to the first upper connection bumps 151 and may electrically connect second pads 129 of the upper semiconductor device 120 to the second upper connection bumps 153. For example, the second redistribution pattern 172 may include conductive line patterns 171 extending in a horizontal direction and conductive via patterns 173 extending in a vertical direction.

In addition, the second redistribution pattern 172 may include fourth upper bump pads 175 to which the first upper connection bumps 151 are attached, respectively, and fifth upper bump pads 177 to which the second upper connection bumps 153 are attached, respectively. At least parts of the fourth upper bump pads 175 and at least parts of the fifth upper bump pads 177 may protrude from a lower surface of the second redistribution insulation layer 179. In exemplary embodiments, each of the fifth upper bump pads 177 connected to the second upper connection bumps 153 may have a width greater than that of each of the fourth upper bump pads 175 connected to the first upper connection bumps 151.

Figure 10:
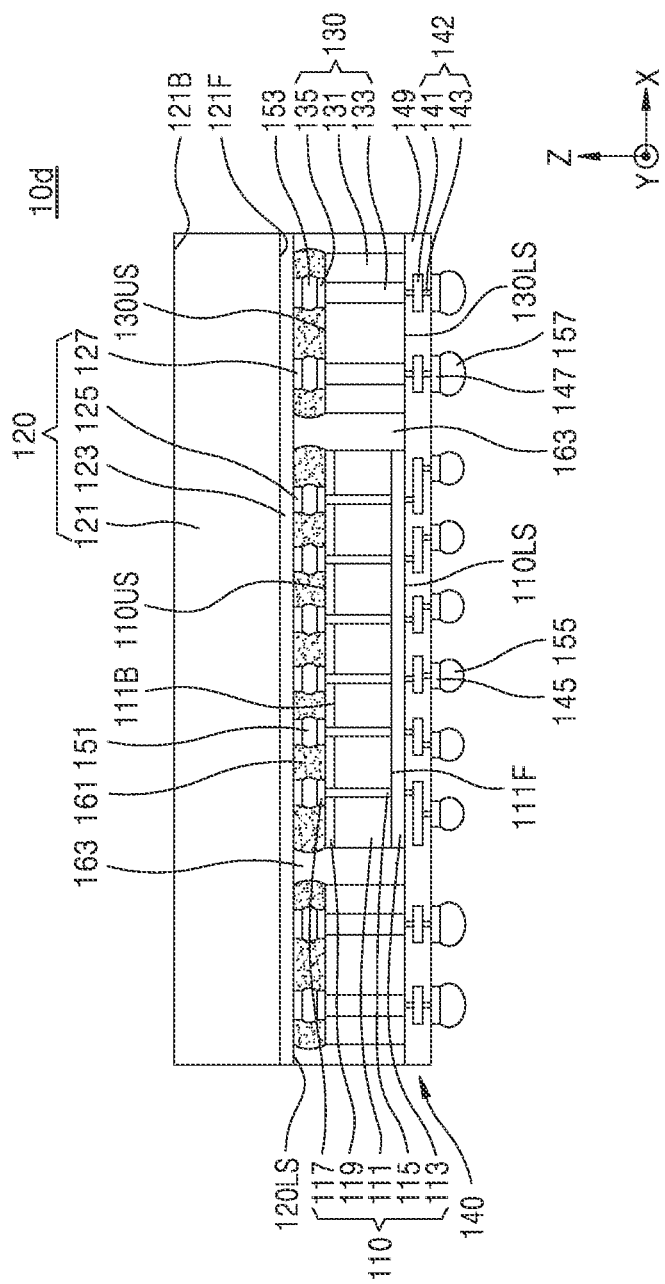
FIG. 10 is a cross-sectional view illustrating a semiconductor package according to exemplary embodiments.

FIG. 10 is a cross-sectional view illustrating a semiconductor package 10*d* according to various exemplary embodiments.

The semiconductor package 10d illustrated in FIG. 10 may be the same or similar to the semiconductor package 10 illustrated in FIG. 1 except that the lower semiconductor device 110 is flipped. Hereinafter, a difference between the semiconductor package 10d illustrated in FIG. 10 and the semiconductor package 10 illustrated in FIG. 1 will be mainly described.

Referring to FIG. 10, the lower semiconductor device 110 may be arranged so that the first surface 111F of the first semiconductor substrate 111 faces the first redistribution structure 140 and the second surface 111B of the first semiconductor substrate 111 faces the second upper semiconductor device 120. The first semiconductor device layer 113 on the first surface 111F of the first semiconductor substrate 111 may be positioned in a lower portion of the lower semiconductor device 110 adjacent to the first redistribution structure 140 and the first back side protective layer 119 on the second surface 111B of the first semiconductor substrate 111 may be positioned in an upper portion of the lower semiconductor device 110 adjacent to the upper semiconductor device 120. Because the first semiconductor device layer 113 is positioned in the lower portion of the lower semiconductor device 110, a length of a signal transmission path between the external device and the lower semiconductor device 110 may be reduced.

Figure 11:
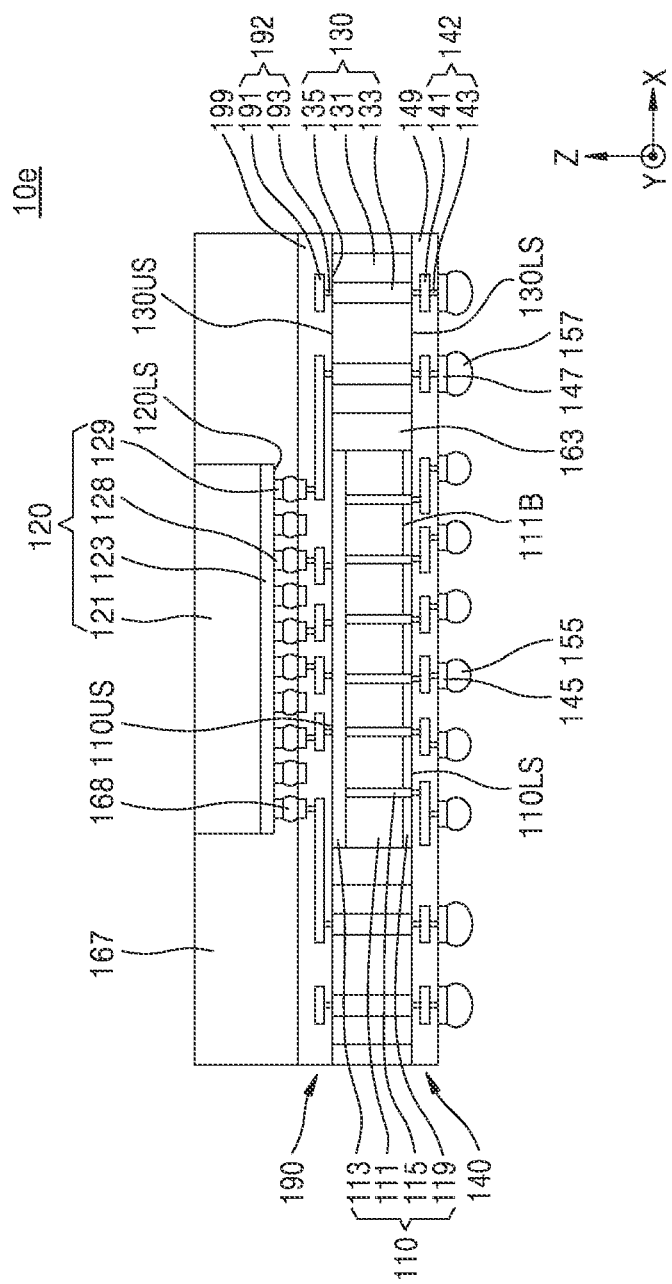
FIG. 11 is a cross-sectional view illustrating a semiconductor package according to exemplary embodiments.

FIG. 11 is a cross-sectional view illustrating a semiconductor package 10e according to various exemplary embodiments.

The semiconductor package 10e illustrated in FIG. 11 may be the same as or similar to the semiconductor package 10 illustrated in FIG. 1 except that the first upper connection bumps 151 and the second upper connection bumps 153 are omitted and a third redistribution structure 190 is further included. Hereinafter, a difference between the semiconductor package 10e illustrated in FIG. 11 and the semiconductor package 10 illustrated in FIG. 1 will be mainly described.

Referring to FIG. 11, the third redistribution structure 190 may be arranged on the first molding layer 163 surrounding the upper surface 110US of the lower semiconductor device 110, the upper surfaces 130US of the connecting substrates 130, the side surfaces of the lower semiconductor device 110, and the side surfaces of the connecting substrates 130. The third redistribution structure 190 may include a third redistribution pattern 192 and a third redistribution insulation layer 199.

The third redistribution insulation layer 199 may cover the upper surface 110US of the lower semiconductor device 110, the upper surfaces 130US of the connecting substrates 130, and an upper surface of the first molding layer 163. The third redistribution insulation layer 199 may electrically insulate various components included in the third redistribution structure 190 from each other.

The third redistribution pattern 192 may electrically connect the lower semiconductor device 110 to the upper semiconductor device 120 and may electrically connect the second through electrodes 133 of the connecting substrates 130 to the upper semiconductor device 120. For example, the third redistribution pattern 192 may include conductive line patterns 191 extending in a horizontal direction and conductive via patterns 193 extending in a vertical direction.

On the third redistribution structure 190, the upper semiconductor device 120 and a molding layer 167 covering at least a part of the upper semiconductor device 120 may be arranged. Between the upper semiconductor device 120 and the third redistribution pattern 192 exposed to the upper side of the third redistribution insulation layer 199, connection bumps 168 for electrically connecting the upper semiconductor device 120 to the third redistribution pattern 192 may be arranged. For example, the first pads 128 of the upper semiconductor device 120 may be electrically connected to the first through electrodes 115 of the lower semiconductor device 110 through the connection bumps 168 and the third redistribution pattern 192. The second pads 129 of the upper semiconductor device 120 may be electrically connected to the second through electrodes 133 of the connecting substrates 130 through the connection bumps 168 and the third redistribution pattern 192.

Figure 12:
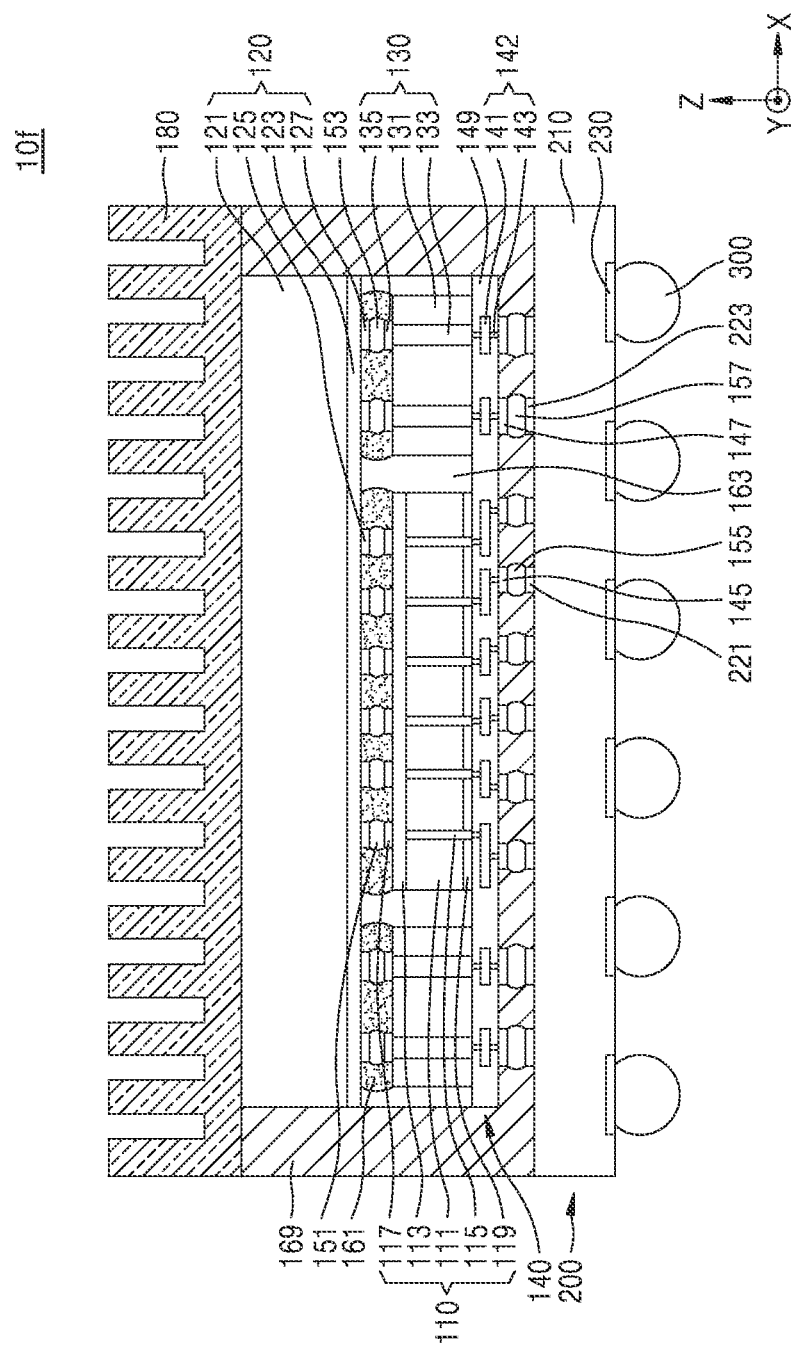
FIG. 12 is a cross-sectional view illustrating a semiconductor package according to exemplary embodiments.

FIG. 12 is a cross-sectional view illustrating a semiconductor package 10f according to various exemplary embodiments.

The semiconductor package 10f illustrated in FIG. 12 may be the same as or similar to the semiconductor package 10 illustrated in FIG. 1 except that a package substrate 200, a second molding layer 169, and a heat dissipation member 180 are further included. Hereinafter, a difference between the semiconductor package 10f illustrated in FIG. 12 and the semiconductor package 10 illustrated in FIG. 1 will be mainly described.

Referring to FIG. 12, the package substrate 200 may be a printed circuit board (PCB). The package substrate 200 may include a substrate base 210 formed of at least one of phenol resin, epoxy resin, or polyimide, or similar material. In addition, the package substrate 200 may include first upper substrate pads 221 and second upper substrate pads 223 arranged on an upper surface of the substrate base 210 and lower substrate pads 230 arranged on a lower surface of the substrate base 210. The first upper substrate pads 221, the second upper substrate pads 223, and the lower substrate pads 230 may be formed of, for example, Cu, Ni, or Al. In the substrate base 210, an internal wiring line (not shown) for electrically connecting the first upper substrate pads 221 to the lower substrate pads 230 and electrically connecting the second upper substrate pads 223 to the lower substrate pads 230 may be formed.

The first lower connection bumps 155 may be arranged between the package substrate 200 and the lower semiconductor device 110. In more detail, the first lower connection bumps 155 may be arranged between the first upper substrate pads 221 of the package substrate 200 and the first lower bump pads 145 and may electrically connect the first upper substrate pads 221 to the first lower bump pads 145. The first lower connection bumps 155 may be used for signal transmission between the package substrate 200 and the lower semiconductor device 110 or signal transmission between the package substrate 200 and the upper semiconductor device 120. In exemplary embodiments, power provided by the external device may be supplied to the lower semiconductor device 110 through the package substrate 200, the first lower connection bumps 155, and the first through electrodes 115.

The second lower connection bumps 157 may be arranged between the package substrate 200 and the connecting substrates 130. In more detail, the second lower connection bumps 157 may be arranged between the second upper substrate pads 223 of the package substrate 200 and the second lower bump pads 147 and may electrically connect the second upper substrate pads 223 and the second lower bump pads 147. The second lower connection bumps 157 may be used for signal transmission between the package substrate 200 and the upper semiconductor device 120. In exemplary embodiments, power provided by the external device may be supplied to the upper semiconductor device 120 through the package substrate 200, the second lower connection bumps 157, and the second through electrodes 133.

External connection terminals 300 may be attached onto a lower surface of the package substrate 200. The external connection terminals 300 may be attached onto the lower substrate pads 230. The external connection terminals 300 may be, for example, solder balls or bumps. The external connection terminals 300 may electrically connect the semiconductor package 10f and the external device.

The second molding layer 169 may fill a gap between the first redistribution structure 140 and the package substrate 200. In addition, the second molding layer 169 may surround side surfaces of the first molding layer 163 and the side surfaces of the upper semiconductor device 120. The second molding layer 169 may contact the side surfaces of the upper semiconductor device 120 and the first molding layer 163. The second molding layer 169 may include epoxy-group molding resin or polyimide-group molding resin. For example, in some exemplary embodiments, the second molding layer 169 may include EMC. The second molding layer 169 may be formed by, for example, a molded underfill process.

The heat dissipation member 180 may be arranged on an upper surface of the upper semiconductor device 120. For example, the heat dissipation member 180 may include a material with high thermal conductivity. The heat dissipation member 180 may be, for example, a heat sink, a heat spreader, or a heat pipe. Although not shown in detail in FIG. 12, between the heat dissipation member 180 and the upper semiconductor device 120, a thermal interface material (TIM) may be provided therebetween. The TIM may enhance physical coupling and thermal coupling between the heat dissipation member 180 and the upper semiconductor device 120

Figure 13:
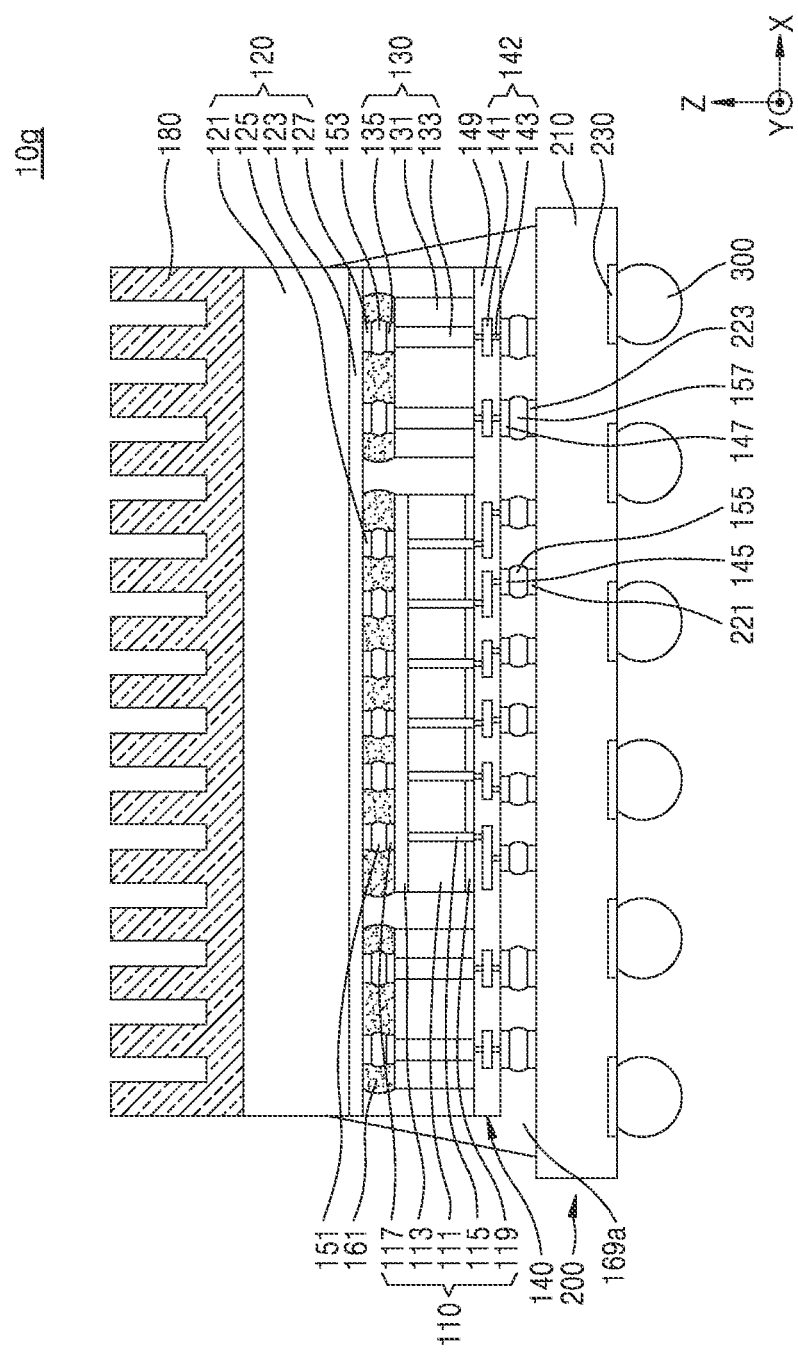
FIG. 13 is a cross-sectional view illustrating a semiconductor package according to exemplary embodiments.

FIG. 13 is a cross-sectional view illustrating a semiconductor package 10g according to various exemplary embodiments.

The semiconductor package 10g illustrated in FIG. 13 may be the same as or similar to the semiconductor package 10f illustrated in FIG. 12 except for a shape of a second molding layer 169a. Hereinafter, a difference between the semiconductor package 10g illustrated in FIG. 13 and the semiconductor package 10f illustrated in FIG. 12 will be mainly described.

Referring to FIG. 13, the second molding layer 169a may expose at least parts of the side surfaces of the upper semiconductor device 120. That is, the second molding layer 169a may entirely or partially expose the side surfaces of the upper semiconductor device 120. For example, the second molding layer 169a may be formed by a capillary underfill process. As at least parts of the side surfaces of the upper semiconductor device 120 are exposed, heat dissipation characteristics of the upper semiconductor device 120 may improve.

FIGS. 14A to 14M are cross-sectional views illustrating a method of manufacturing a semiconductor package, according to various exemplary embodiments. Hereinafter, referring to FIGS. 14A to 14M, a method of manufacturing the semiconductor package 10f illustrated in FIG. 12 will be described. Previously given description will be omitted or simplified or conciseness.

Figure 14A:
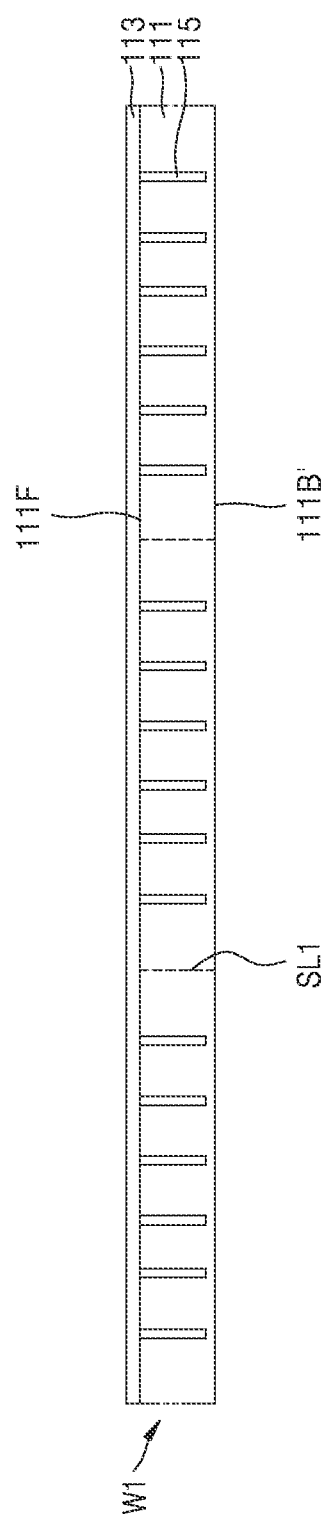
FIGS. 14A to 14M are cross-sectional views illustrating a method of manufacturing a semiconductor package, according to exemplary embodiments.

Referring to FIG. 14A, a first semiconductor wafer W1 is provided. The first semiconductor wafer W1 may be formed of a plurality of semiconductor devices divided by first scribe lanes SL1. Each of the semiconductor devices includes the first semiconductor substrate 111, the first semiconductor device layer 113, and the first through electrodes 115. The first semiconductor substrate 111 may include a first surface 111F and a second surface 111B' opposite to each other. The first semiconductor device layer 113 may be formed on the first surface 111F of the first semiconductor substrate 111. The first through electrodes 115 may extend from the first surface 111F of the first semiconductor substrate 111 to the inside of the first semiconductor substrate 111 and may be columnar.

Figure 14B:
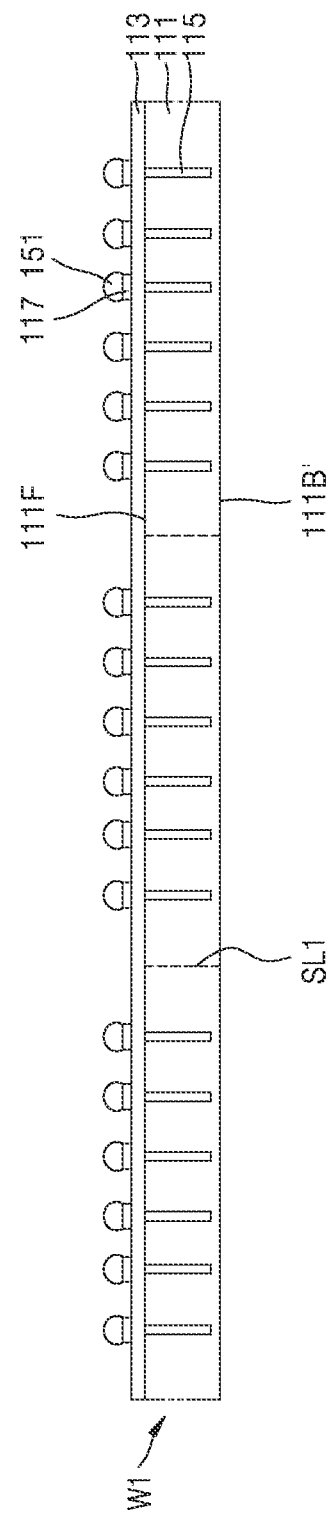

Referring to FIG. 14B, on the first surface 111F of the first semiconductor substrate 111, the first upper bump pads 117 electrically connected to the first through electrodes 115 are formed and the first upper connection bumps 151 are formed on the first upper bump pads 117.

Figure 14C:
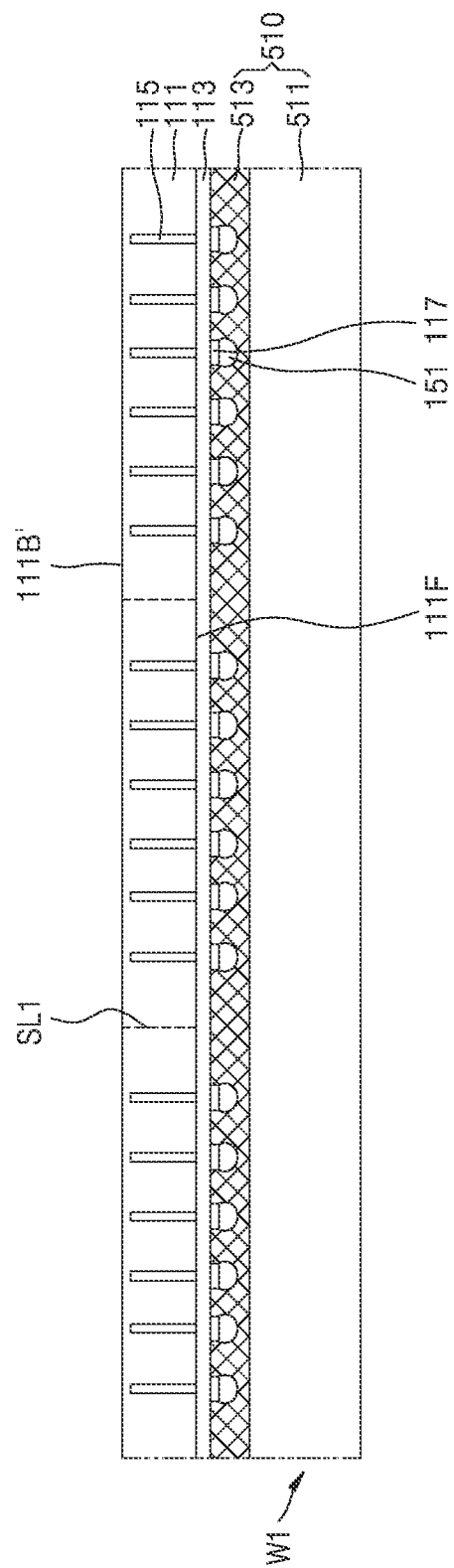

Referring to FIG. 14C, the first semiconductor wafer W1 on which the first upper connection bumps 151 are formed is attached onto a carrier substrate 510. The carrier substrate 510 may include a supporting substrate 511 and an adhesive material 513 on the supporting substrate 511. The first semiconductor wafer W1 may be attached to the carrier substrate 510 so that the first upper connection bumps 151 face the carrier substrate 510. The adhesive material 513 may surround the first upper bump pads 117.

Figure 14D:
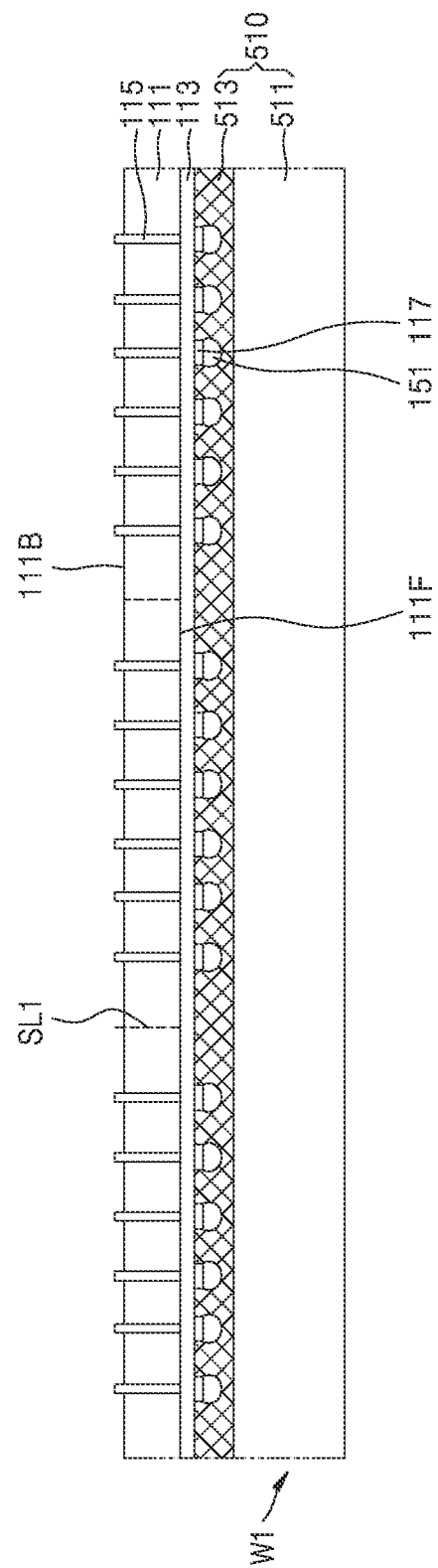

Referring to FIG. 14D, parts of the first through electrodes 115 may be exposed by removing a part of the first semiconductor substrate 111. As a result of removing the part of the first semiconductor substrate 111, the first through electrodes 115 pass through the first semiconductor substrate 111. Selectively, as illustrated in FIG. 14D, the first through electrodes 115 may protrude from the second surface 111B of the first semiconductor substrate 111.

In order to expose the first through electrodes 115, a part of the first semiconductor substrate 111 may be removed by using a chemical mechanical polishing (CMP) process, an etch-back process, or a combination of the above processes.

Figure 14E:
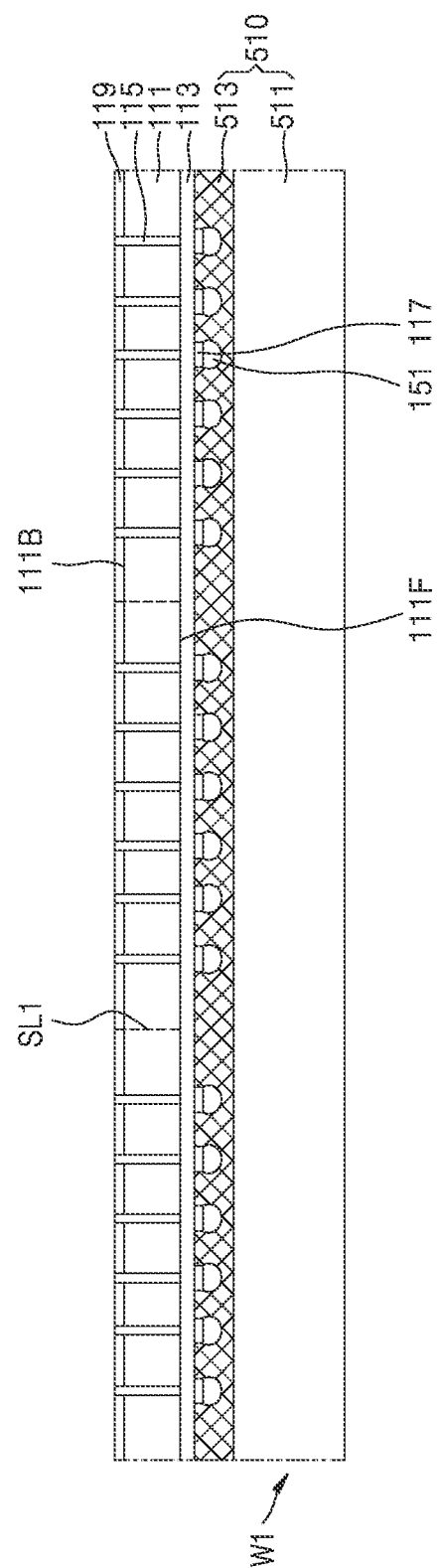

Referring to FIG. 14E, a first back side protective layer 119 covering the second surface 111B of the first semiconductor wafer W1 is formed. The first back side protective layer 119 may be formed by, for example, a spin coating process or a spray process. The first back side protective layer 119 may be formed of, for example, insulating polymer. In order to form the first back side protective layer 119, an insulating polymer layer covering the second surface 111B of the first semiconductor substrate 111 and the first through electrodes 115 may be formed and the first through electrodes 115 may be exposed by partially removing the insulating polymer layer. For example, a part of the insulating polymer layer may be removed by the etch-back process.

Figure 14F:
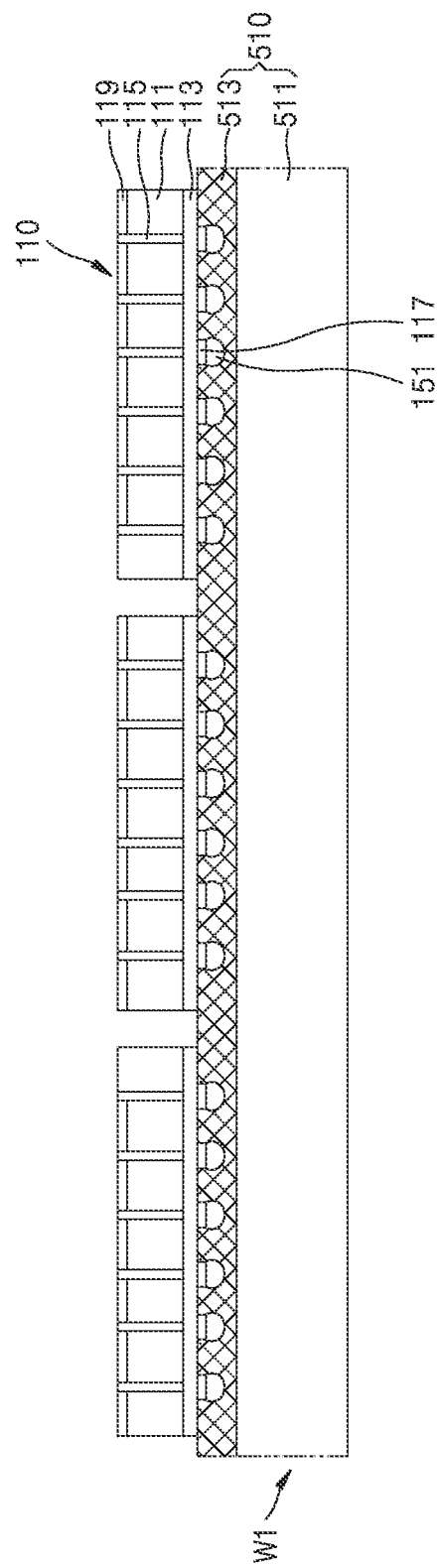

Referring to FIG. 14F, after forming the first back side protective layer 119, a sawing process of cutting the first semiconductor wafer W1 along the first scribe lanes SL1 is performed. Through the sawing process, the first semiconductor wafer W1 may be divided into a plurality of lower semiconductor devices 110. Additionally, the supporting substrate 511 may be removed.

Figure 14G:
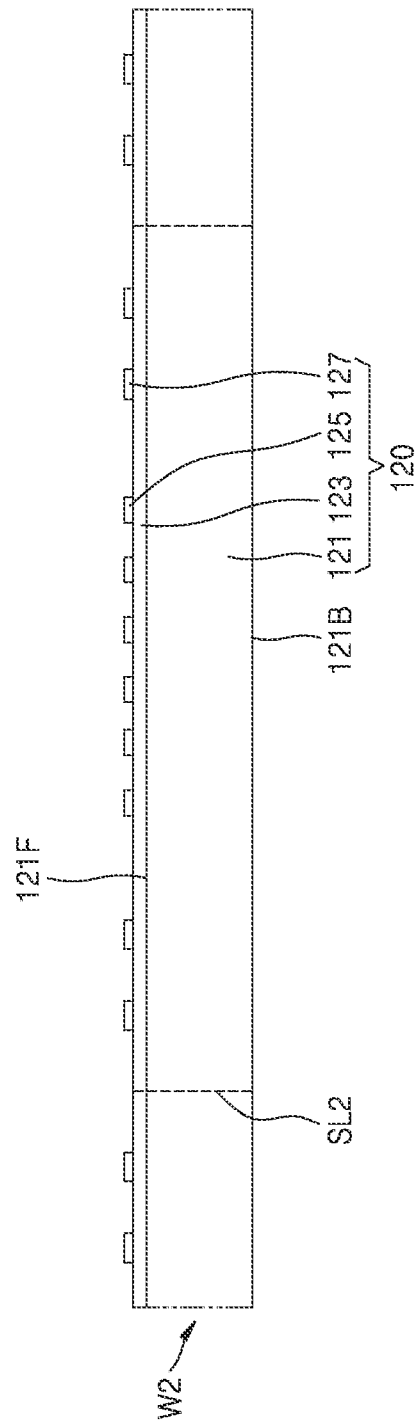

Referring to FIG. 14G, a second semiconductor wafer W2 is provided. The second semiconductor wafer W2 may be formed of a plurality of second semiconductor devices divided by second scribe lanes SL2. Each of the second semiconductor devices includes a second semiconductor substrate 121, a second semiconductor device layer 123, first bump pads 125, and second bump pads 127. The second semiconductor substrate 121 may include a first surface 121F and a second surface 121B opposite to each other. The second semiconductor device layer 123 may be formed on the first surface 121F of the second semiconductor substrate 121.

Figure 14H:
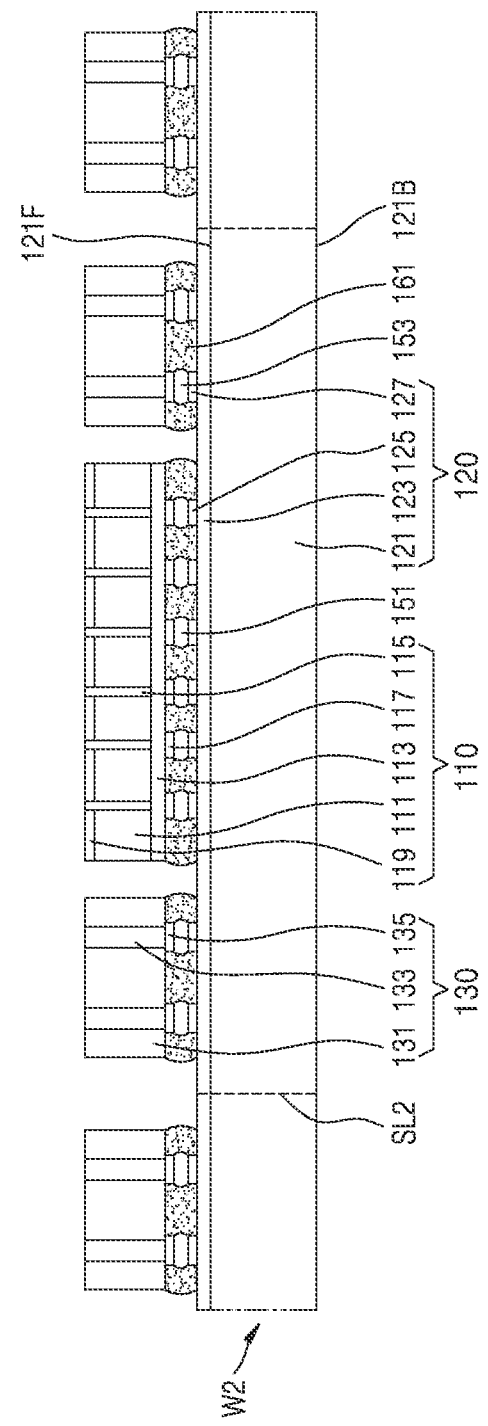

Referring to FIG. 14H, the lower semiconductor device 110 illustrated in FIG. 14F and the connecting substrates 130 are stacked on the second semiconductor wafer W2. The lower semiconductor device 110 may be positioned on the first bump pads 125 of the second semiconductor wafer W2 and the first upper connection bumps 151 may be arranged between the first bump pads 125 and the first upper bump pads 117 of the lower semiconductor device 110. The connecting substrates 130 are positioned on the second bump pads 127 of the second semiconductor wafer W2 and the second upper connection bumps 153 may be arranged between the second bump pads 127 and the second upper bump pads 135 of the connecting substrates 130. An insulation adhesive layer 161 may be formed on one surface of the lower semiconductor device 110 and one surface of each of the connecting substrates 130. The insulation adhesive layer 161 may be, for example, NCF.

After positioning the lower semiconductor device 110 and the connecting substrates 130 on the second semiconductor wafer W2, a reflow process or a thermal compression process may be performed. Through the reflow process or the thermal compression process, the first upper connection bumps 151 may be attached to the first upper bump pads 117 and the first bump pads 125 and the second upper connection bumps 153 may be attached to the second upper bump pads 135 and the second bump pads 127.

Figure 14I:
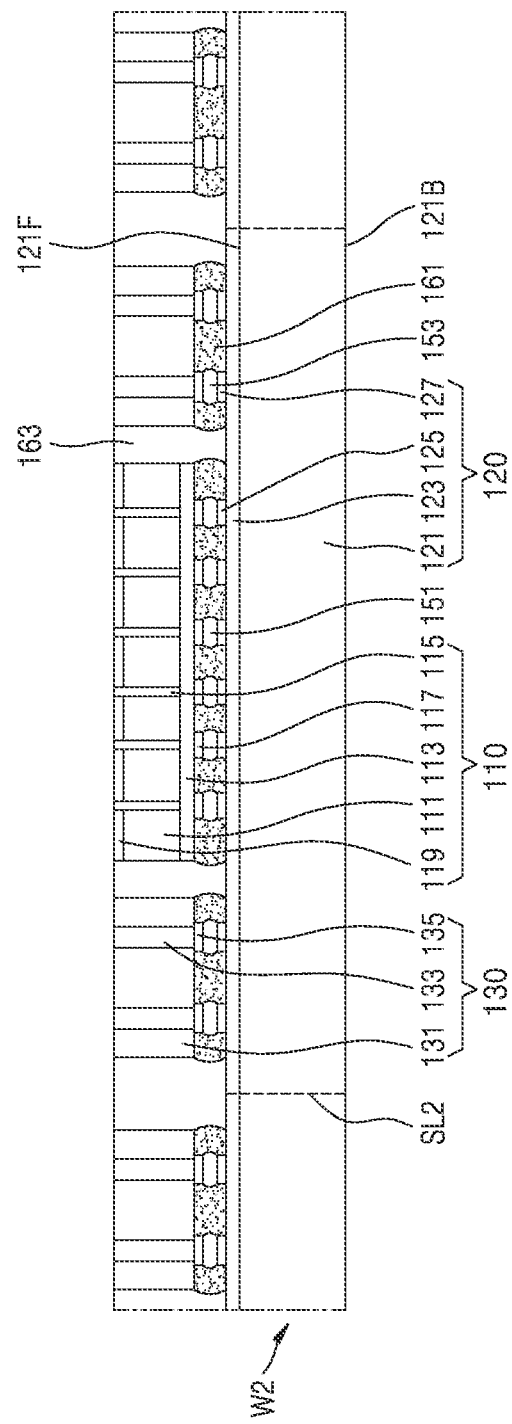

Referring to FIG. 14I, the first molding layer 163 for molding the lower semiconductor device 110 and the connecting substrates 130 is formed on the second semiconductor wafer W2. In order to form the first molding layer 163, a molding material may be supplied onto the second semiconductor wafer W2 and the molding material may be hardened by a hardening process.

The first molding layer 163 may cover the side surfaces of the lower semiconductor device 110 and the side surfaces of the connecting substrates 130 and may not cover one surface of the lower semiconductor device 110 and one surface of each of the connecting substrates 130 that face the second semiconductor wafer W2. For example, in order to form the first molding layer 163, a molding material covering the lower semiconductor device 110 and the connecting substrates 130 may be formed and the molding material may be removed until the one surface of the lower semiconductor device 110 and the one surface of each of the connecting substrates 130 are exposed by a planarizing process such as the CMP process. Alternatively, in some exemplary embodiments, in order to form the first molding layer 163, a molding film may be arranged on the one surface of the lower semiconductor device 110 and the one surface of each of the connecting substrates 130, and then a molding material that is injected between the molding film and the second semiconductor wafer W2 may be hardened.

Figure 14J:
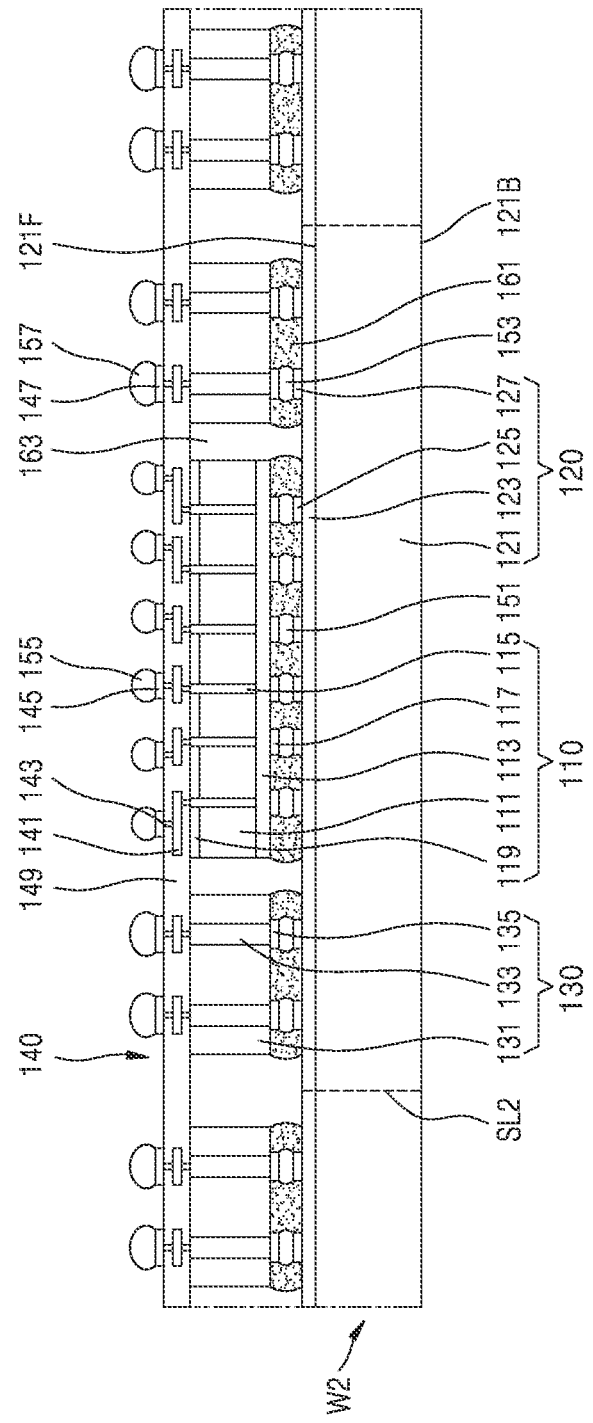

Referring to FIG. 14J, the first redistribution structure 140 may be formed on the one surface of the lower semiconductor device 110 and the one surface of each of the connecting substrates 130 that are exposed upward. After forming the first redistribution structure 140, the first lower connection bumps 155 on the first lower bump pads 145 and the second lower connection bumps 157 on the second lower bump pads 147 are formed.

Figure 14K:
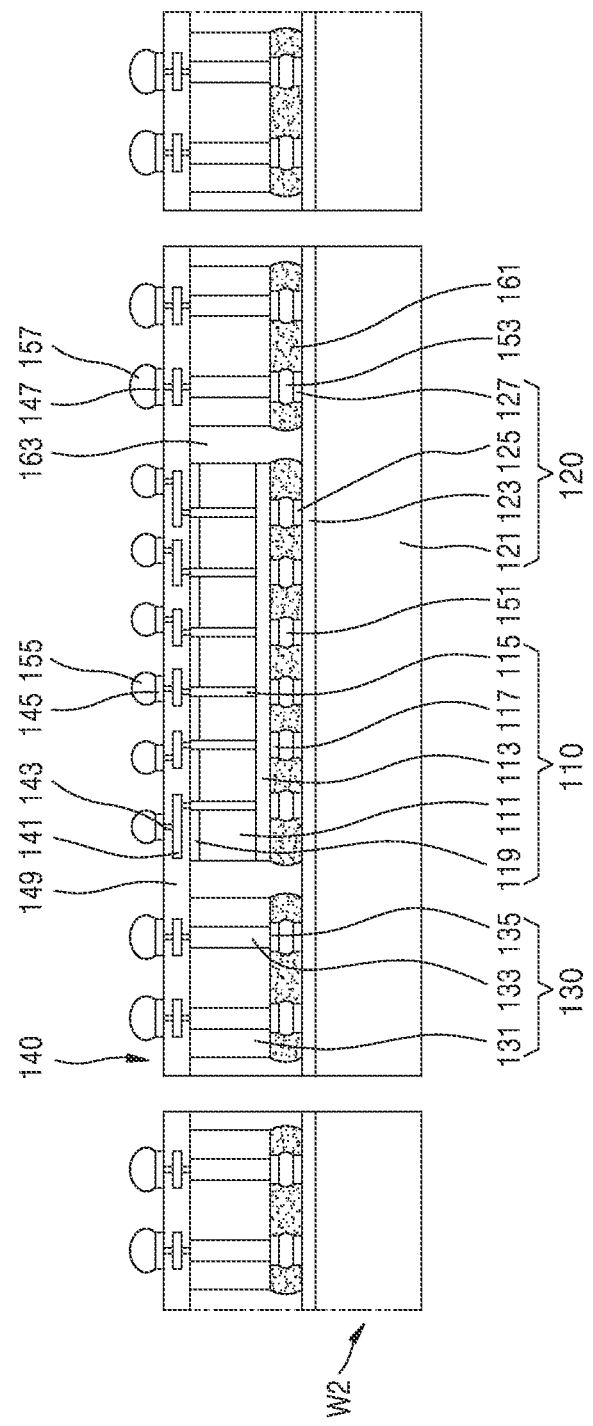

Referring to FIG. 14K, a sawing process of cutting the resultant material of FIG. 14J along the second scribe lanes SL2 of the second semiconductor wafer W2 is performed. Through the sawing process, the resultant material of FIG. 14J may be divided into individualized semiconductor packages 10 as illustrated in FIG. 1.

Figure 14L:
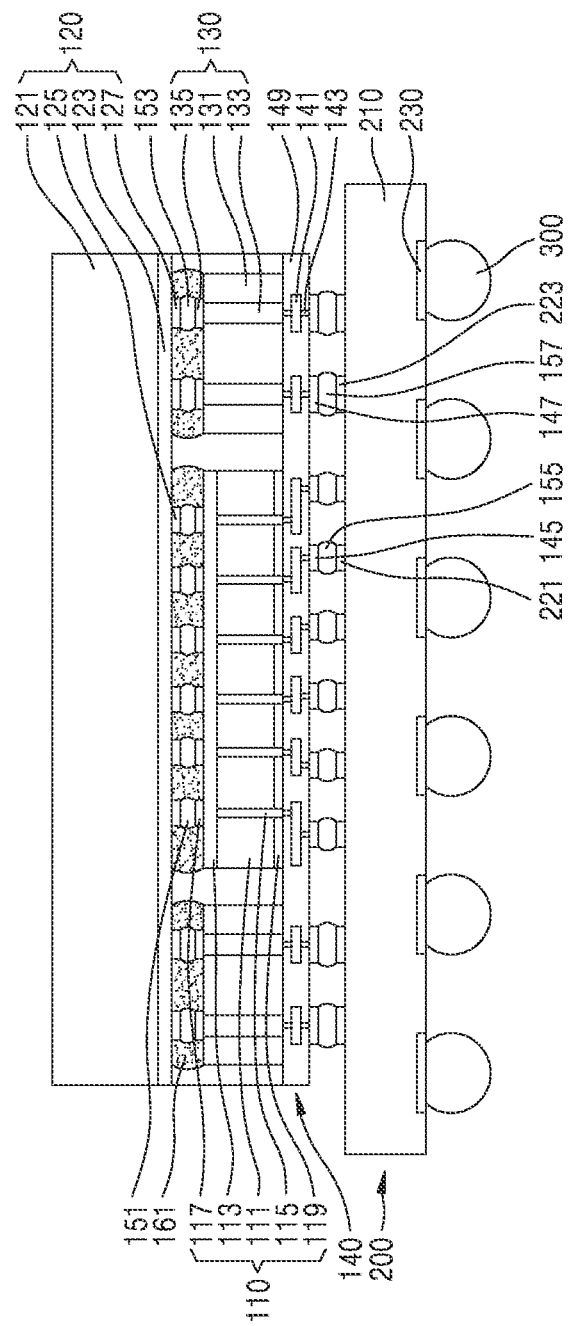

Referring to FIG. 14L, the resultant material of FIG. 14K is stacked on the package substrate 200. The first lower connection bumps 155 may be positioned on the first upper substrate pads 221 of the package substrate 200 and the second lower connection bumps 157 may be positioned on the second upper substrate pads 223 of the package substrate 200. Through the reflow process or the thermal compression process, the first lower connection bumps 155 may be attached to the first upper substrate pads 221 and the second lower connection bumps 157 may be attached to the second upper substrate pads 223.

Figure 14M:
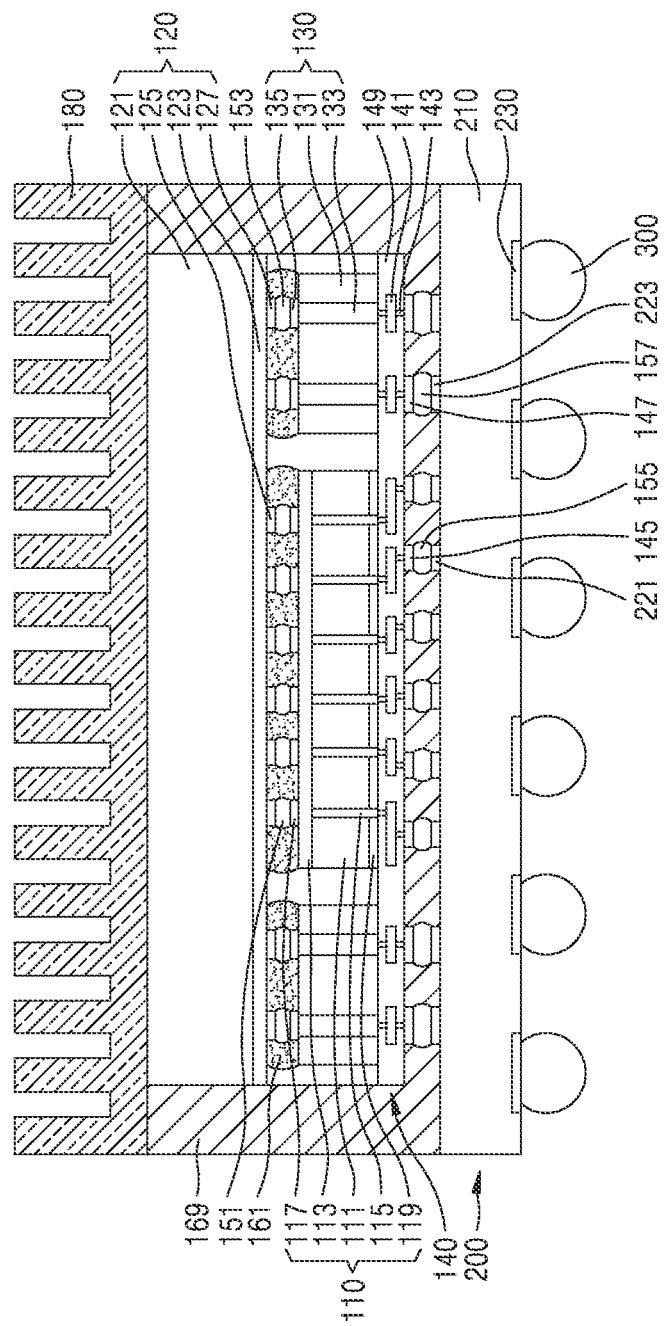

Referring to FIG. 14M, the second molding layer 169 may be formed on the package substrate 200. The second molding layer 169 may fill a space between the first redistribution structure 140 and the package substrate 200 and may cover the side surfaces of the first molding layer 163 and side surfaces of the first redistribution structure 140. For example, the second molding layer 169 may be formed by the molded underfill process.

After forming the second molding layer 169, the heat dissipation member 180 may be attached onto the upper semiconductor device 120. For example, the TIM may be between the heat dissipation member 180 and the upper semiconductor device 120 and the heat dissipation member 180 may be physically coupled to the upper semiconductor device 120 through the TIM.

In exemplary embodiments, when the upper semiconductor device 120 is a logic chip and the lower semiconductor device 110 is a memory chip, since the heat dissipation member 180 is attached to the logic chip which generates a relatively large amount of heat, the heat dissipation characteristics of the semiconductor package 10 may improve. In addition, since power provided by the external device is supplied to the logic chip through the second through electrodes 133 of the connecting substrates 130 each having a large width, power may be stably supplied to the logic chip.

Figure 15A:
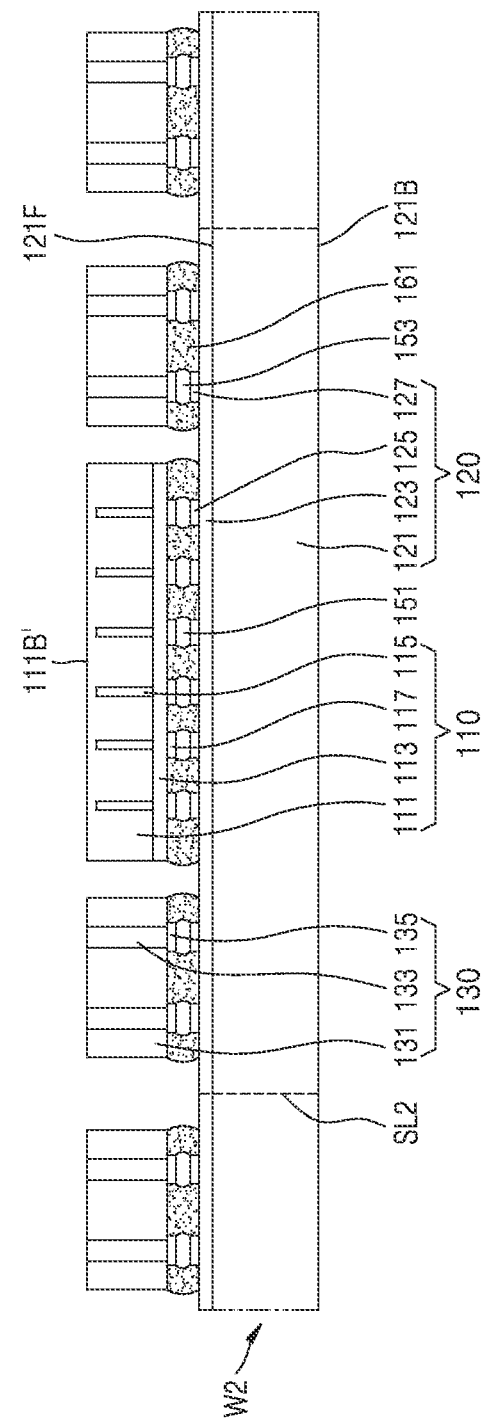
FIGS. 15A to 15C are cross-sectional views illustrating a method of manufacturing a semiconductor package, according to exemplary embodiments.
Figure 15B:
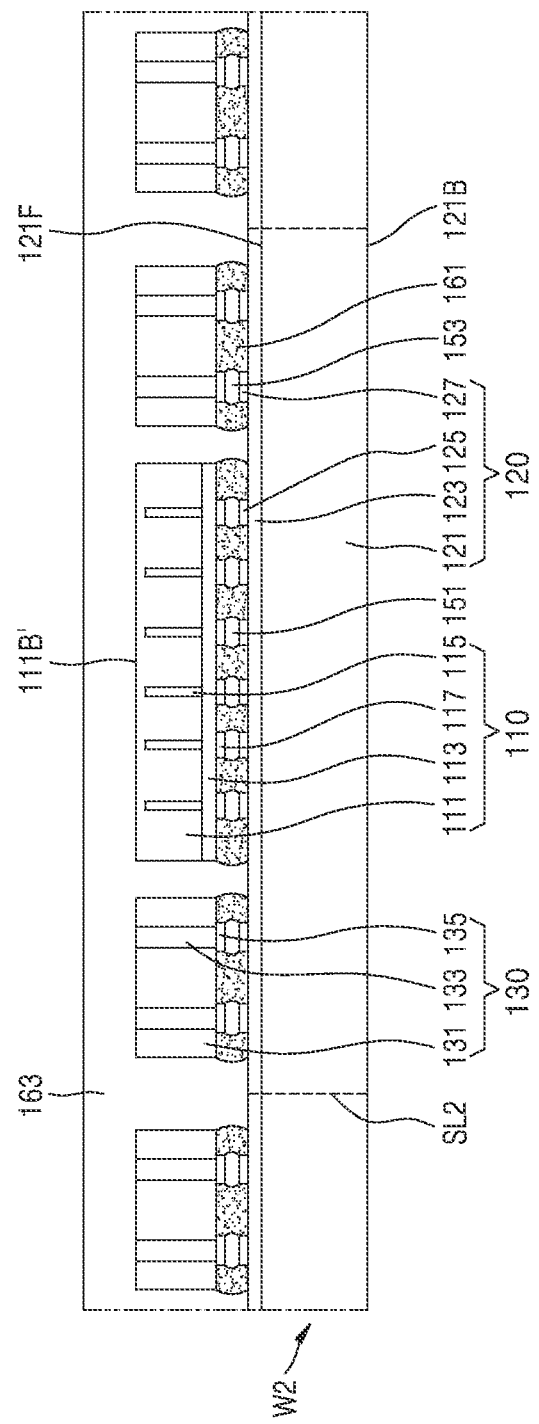
Figure 15C:
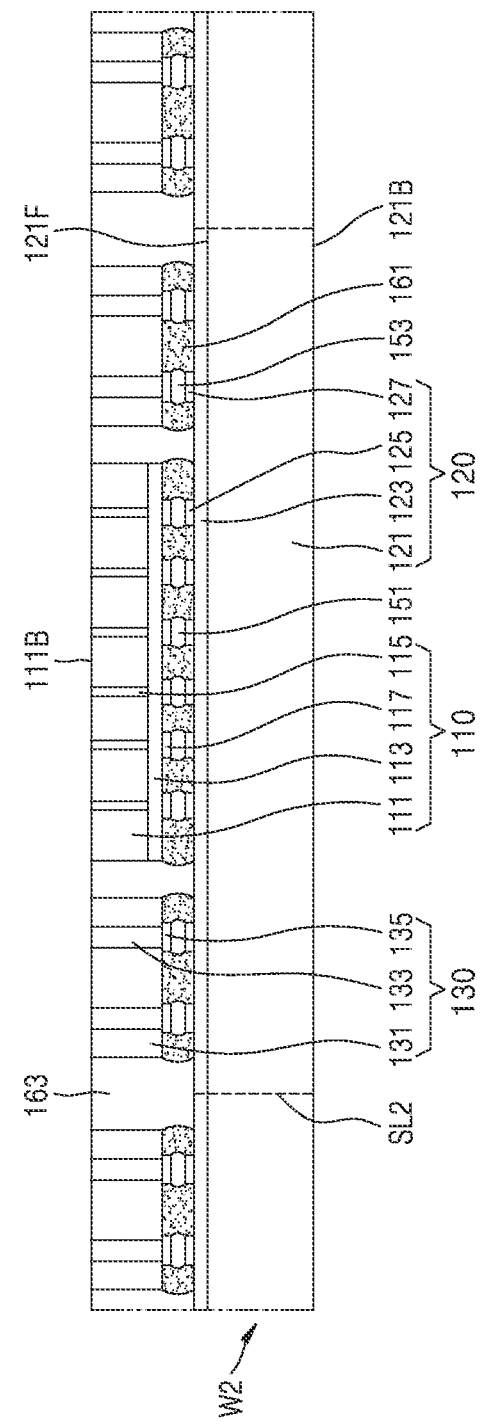

FIGS. 15A to 15C are cross-sectional views illustrating a method of manufacturing a semiconductor package, according to various exemplary embodiments. Hereinafter, a difference between the method of manufacturing the semiconductor package 10e described with reference to FIGS. 14A to 14M and the method of manufacturing the semiconductor package described with reference to FIGS. 15A to 15C will be mainly described.

Referring to FIG. 15A, the lower semiconductor device 110 and the connecting substrates 130 may be stacked on the second semiconductor wafer W2. At this time, in the lower semiconductor device 110, like in FIG. 14B, the first through electrodes 115 are not exposed through the second surface 111B' of the first semiconductor substrate 111.

Referring to FIG. 15B, on the second semiconductor wafer W2, the first molding layer 163 for molding the lower semiconductor device 110 and the connecting substrates 130 is formed. The first molding layer 163 may cover the lower semiconductor device 110 and the connecting substrates 130.

Referring to FIG. 15C, a polishing process may be performed on the first molding layer 163, the lower semiconductor device 110, and the connecting substrates 130 to expose the first through electrodes 115. For example, the CMP process may be performed on the first molding layer 163, the lower semiconductor device 110, and the connecting substrates 130. By the CMP process, the first through electrodes 115 of the lower semiconductor device 110 may be exposed through the second surface 111B of the first semiconductor substrate 111. In addition, by the CMP process, a planarized surface may be obtained on the first molding layer 163, the lower semiconductor device 110, and the connecting substrates 130.

After performing the polishing process, processes the same as or similar to those of FIGS. 14J to 14M are further performed so that the semiconductor package may be manufactured.

While various embodiments have been particularly shown and described above, it will be understood that various changes in form and details may be made therein without departing from the spirit and scope of the present disclosure as defined in the following claims.

What is claimed is:

1. A semiconductor package comprising:
a lower semiconductor device including a first substrate having a first surface, a plurality of first through electrodes each having a first horizontal width, and a plurality of second through electrodes each having a second horizontal width, wherein the plurality of first through electrodes and the plurality of second through electrodes each extend from a lower surface of the lower semiconductor device to the first surface of the first substrate, and the second horizontal width is greater than the first horizontal width; and
an upper semiconductor device arranged on the lower semiconductor device and electrically connected to the plurality of first through electrodes and to the plurality of second through electrodes, the upper semiconductor device configured to receive power through the plurality of second through electrodes.

2. The semiconductor package of claim 1, wherein the first horizontal width is about 1 μm to about 7 μm and the second horizontal width is about 10 μm to about 20 μm.

3. The semiconductor package of claim 1, wherein the lower semiconductor device and the upper semiconductor device have a same plane area.

4. The semiconductor package of claim 1, wherein the first surface faces the upper semiconductor device,
the first substrate includes a second surface opposite to the first surface, and
the lower semiconductor device comprises
a semiconductor device layer arranged on the first surface of the first substrate.

5. The semiconductor package of claim 1, wherein the first surface faces the upper semiconductor device,
the first substrate includes a second surface opposite to the first surface, and
wherein the lower semiconductor device comprises:
a plurality of first upper pads on the first surface of the first substrate, the plurality of first upper pads electrically connected to the plurality of first through electrodes; and
a plurality of second upper pads on the first surface of the first substrate, the plurality of second upper pads electrically connected to the plurality of second through electrodes, and
wherein a horizontal width of each of the plurality of second upper pads is greater than a horizontal width of each of the plurality of first upper pads.

6. The semiconductor package of claim 5, wherein the upper semiconductor device comprises:
a second substrate including a lower surface facing the lower semiconductor device;
a plurality of first pads on the lower surface of the second substrate, the plurality of first pads electrically connected to the plurality of first upper pads; and
a plurality of second pads on the lower surface of the second substrate, the plurality of second pads electrically connected to the plurality of second upper pads, and
wherein a horizontal width of each of the plurality of second pads is greater than a horizontal width of each of the plurality of first pads.

7. The semiconductor package of claim 1, further comprising:
a plurality of first upper connection bumps electrically connecting the upper semiconductor device to the plurality of first through electrodes;
a plurality of second upper connection bumps electrically connecting the upper semiconductor device to the plurality of second through electrodes; and
an insulation adhesive layer between the lower semiconductor device and the upper semiconductor device, the insulation adhesive layer surrounding the plurality of first upper connection bumps and the plurality of second upper connection bumps.

8. The semiconductor package of claim 1, wherein the plurality of first through electrodes are arranged in a central portion of the lower semiconductor device and the plurality of second through electrodes are arranged in an outer portion of the lower semiconductor device.

9. The semiconductor package of claim 1, wherein the upper semiconductor device is configured to generate an amount of heat greater than an amount of heat generated by the lower semiconductor device.

10. A semiconductor package comprising:
a redistribution structure;
a lower semiconductor device arranged on the redistribution structure and including a plurality of first through electrodes each having a first horizontal width;
two connecting substrates arranged on the redistribution structure and spaced apart each other with the lower semiconductor device interposed therebetween, wherein each of the two connecting substrates includes a plurality of second through electrodes each having a second horizontal width greater than the first horizontal width; and
an upper semiconductor device arranged on the lower semiconductor device and the two connecting substrates, the upper semiconductor device electrically connected to the plurality of first through electrodes of the lower semiconductor device and the plurality of second through electrodes of each of the two connecting substrates,
wherein the lower semiconductor device comprises:
a first substrate including a first surface facing the upper semiconductor device and a second surface opposite to the first surface; and
a plurality of first upper pads arranged on the first surface of the first substrate and electrically connected to the plurality of first through electrodes,
wherein each of the two connecting substrates comprises:
a plurality of second upper pads arranged on an upper surface of each of the two connecting substrates and electrically connected to the plurality of second through electrodes, wherein a horizontal width of each of the plurality of second upper pads is greater than a horizontal width of each of the plurality of first upper pads, and wherein the upper semiconductor device comprises:
a second substrate including a lower surface facing the lower semiconductor device;
a plurality of first pads arranged on the lower surface of the second substrate and electrically connected to the plurality of first upper pads; and
a plurality of second pads arranged on the lower surface of the second substrate and electrically connected to the plurality of second upper pads, wherein a horizontal width of each of the plurality of second pads is greater than a horizontal width of each of the plurality of first pads.

11. The semiconductor package of claim 10, wherein the first horizontal width is about 1 μm to about 7 μm and the second horizontal width is about 10 μm to about 20 μm.

12. The semiconductor package of claim 10, wherein the lower semiconductor device comprises
a semiconductor device layer arranged on the first surface of the first substrate.

13. The semiconductor package of claim 10, further comprising a heat dissipation member on the upper semiconductor device.

14. The semiconductor package of claim 10, wherein the lower semiconductor device includes a memory chip and the upper semiconductor device includes a logic chip.

15. A semiconductor package comprising:
a redistribution structure;
a lower semiconductor device arranged on the redistribution structure and including a plurality of first through electrodes each having a first horizontal width;
a connecting substrate arranged on the redistribution structure and extending along a first side of the lower semiconductor device, wherein the connecting substrate includes a plurality of second through electrodes each having a second horizontal width greater than the first horizontal width; and
an upper semiconductor device arranged on the lower semiconductor device and the connecting substrate, the upper semiconductor device electrically connected to the plurality of first through electrodes and the plurality of second through electrodes,
wherein the lower semiconductor device is horizontally spaced apart from the connecting substrate,
wherein the lower semiconductor device comprises:
a first substrate including a first surface facing the upper semiconductor device and a second surface opposite to the first surface; and
a plurality of first upper pads arranged on the first surface of the first substrate and electrically connected to the plurality of first through electrodes, and
wherein the connecting substrate comprises:
a plurality of second upper pads arranged on an upper surface of the connecting substrate and electrically connected to the plurality of second through electrodes, wherein a horizontal width of each of the plurality of second upper pads is greater than a horizontal width of each of the plurality of first upper pads.

16. The semiconductor package of claim 15, wherein the first horizontal width is about 1 μm to about 7 μm and the second horizontal width is about 10 μm to about 20 μm.

17. The semiconductor package of claim 15, wherein the connecting substrate further extends along the second side of the lower semiconductor device connected to the first side.

18. The semiconductor package of claim 15, further comprising an additional connecting substrate arranged on the redistribution structure and extending along a second side of the lower semiconductor device connected to the first side, wherein the additional connecting substrate includes a plurality of through electrodes electrically connected to the upper semiconductor device and having a horizontal width greater than the first horizontal width.

19. The semiconductor package of claim 15, wherein the lower semiconductor device comprises:
a semiconductor device layer arranged on the first surface of the first substrate, and
wherein the upper semiconductor device comprises:
a second substrate including a lower surface facing the lower semiconductor device;
a plurality of first pads arranged on the lower surface of the second substrate and electrically connected to the plurality of first upper pads; and
a plurality of second pads arranged on the lower surface of the second substrate and electrically connected to the plurality of second upper pads, wherein a horizontal width of each of the plurality of second pads is greater than a horizontal width of each of the plurality of first pads.

* * * * *